(12) United States Patent
Maruyama et al.

(10) Patent No.: US 12,414,346 B2
(45) Date of Patent: Sep. 9, 2025

(54) MANUFACTURING METHOD OF SEMICONDUCTOR DEVICE

(71) Applicant: RENESAS ELECTRONICS CORPORATION, Tokyo (JP)

(72) Inventors: Takahiro Maruyama, Tokyo (JP); Takuya Hagiwara, Tokyo (JP); Takuya Maruyama, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 556 days.

(21) Appl. No.: 17/964,276

(22) Filed: Oct. 12, 2022

(65) Prior Publication Data

US 2023/0146858 A1 May 11, 2023

(30) Foreign Application Priority Data

Nov. 5, 2021 (JP) ................................. 2021-181263

(51) Int. Cl.
*H10D 64/01* (2025.01)
*H01L 21/311* (2006.01)
*H10D 12/00* (2025.01)

(52) U.S. Cl.
CPC ........ *H10D 64/01* (2025.01); *H01L 21/31116* (2013.01); *H10D 12/481* (2025.01)

(58) Field of Classification Search
None
See application file for complete search history.

(56) References Cited

U.S. PATENT DOCUMENTS

| 9,041,050 | B2 | 5/2015 | Matsuura | |
|---|---|---|---|---|
| 2009/0212321 | A1* | 8/2009 | Hsieh | H10D 12/481 |
| | | | | 438/138 |
| 2014/0061810 | A1* | 3/2014 | Sunamura | H10D 30/6734 |
| | | | | 438/585 |
| 2021/0336015 | A1* | 10/2021 | Birner | H10D 62/8503 |

FOREIGN PATENT DOCUMENTS

JP 2013-140885 A 7/2013

* cited by examiner

*Primary Examiner* — Xiaoming Liu
(74) *Attorney, Agent, or Firm* — Rimon P.C.

(57) ABSTRACT

A manufacturing method of a semiconductor device includes a step of preparing a semiconductor substrate having a first main surface and a second main surface, a step of forming a recess in the first main surface and embedding an insulating film in the recess, a step of forming a polysilicon film on the insulating film, a step of forming an interlayer insulating film on the first main surface so as to cover the insulating film and the polysilicon film, and a step of forming a first contact hole and a second contact hole. The semiconductor substrate has a first impurity diffusion region formed in the first main surface, and a second impurity diffusion region in contact with a portion of the first impurity diffusion region, the portion being closer to the second main surface.

10 Claims, 29 Drawing Sheets

MANUFACTURING METHOD OF SEMICONDUCTOR DEVICE

CROSS-REFERENCE TO RELATED APPLICATION

The present application claims priority from Japanese Patent Application No. 2021-181263 filed on Nov. 5, 2021, the content of which is hereby incorporated by reference into this application.

BACKGROUND

The present invention relates to a manufacturing method of a semiconductor device.

There is disclosed techniques listed below.

[Patent Document 1] Japanese Unexamined Patent Application Publication No. 2013-140885

For example, Japanese Unexamined Patent Application Publication No. 2013-140885 (Patent Document 1) discloses a semiconductor device including an insulated gate bipolar transistor (IGBT). The semiconductor device disclosed in Patent Document 1 includes a semiconductor substrate and an interlayer insulating film.

The semiconductor substrate has a first main surface and a second main surface. The second main surface is a surface opposite to the first main surface. The semiconductor substrate has a source region and a channel region. The source region is disposed in the first main surface. The channel region is disposed in contact with the second main surface side of the source region. The interlayer insulating film is disposed on the first main surface. A contact hole (hereinafter referred to as the "first contact hole") is formed in the interlayer insulating film. The first contact hole penetrates the interlayer insulating film and reaches the channel region.

SUMMARY

In addition to an IGBT, a semiconductor device may further include a diode for temperature detection or current detection. When the semiconductor device disclosed in Patent Document 1 further includes such a diode, an insulating film disposed on the first main surface, and a polysilicon film formed on the insulating film are further formed. Furthermore, in this case, a contact hole (hereinafter referred to as the "second contact hole") different from the first contact hole is further formed in the interlayer insulating film.

The first contact hole and the second contact hole are formed by, for example, the following method. First, an interlayer insulating film is formed on a first main surface, and the upper surface of the interlayer insulating film is planarized by chemical mechanical polishing (CMP) or the like. Second, a first resist is formed on the interlayer insulating film. The first resist is patterned such that a position corresponding to a first contact hole opens. Third, the interlayer insulating film is etched with the first resist as a mask until the first main surface is exposed. Consequently, the first contact hole is formed in the interlayer insulating film. Fourth, the first main surface side of the semiconductor substrate is etched with the first resist and the interlayer insulating film as a mask. By this etching, the first contact hole extends into the semiconductor substrate, and a channel region is exposed from the first contact hole. After that, note that the first resist is removed.

Fifth, a second resist is formed on the interlayer insulating film. The second resist is patterned such that a position corresponding to a second contact hole opens. Sixth, the interlayer insulating film is etched with the second resist as a mask until a polysilicon film is exposed. Consequently, the second contact hole is formed in the interlayer insulating film. The reason why the first contact hole and the second contact hole are separately formed as described above is that the thickness of the interlayer insulating film on the source region and the thickness of the interlayer insulating film on the polysilicon film are greatly different from each other, and it is necessary to form the first contact hole such reaching the channel region, and thus, the second contact hole may be formed to penetrate the polysilicon film by simultaneous formation of first contact hole and the second contact hole.

When the first contact hole and the second contact hole are formed by the above-described method, the resist needs to be formed twice, and the manufacturing cost increases.

The present disclosure provides a manufacturing method of a semiconductor device capable of reducing the manufacturing cost for forming the first contact hole and the second contact hole while preventing the second contact hole from penetrating the polysilicon film.

Other problems and novel characteristics will be apparent from the description of the present specification and the accompanying drawings.

A manufacturing method of a semiconductor device according to an embodiment includes a step of preparing a semiconductor substrate having a first main surface and a second main surface, a step of forming a recess in the first main surface and embedding an insulating film in the recess, a step of forming a polysilicon film on the insulating film, a step of forming an interlayer insulating film on the first main surface so as to cover the insulating film and the polysilicon film, and a step of forming a first contact hole and a second contact hole. The semiconductor substrate has a first impurity diffusion region formed in the first main surface, and a second impurity diffusion region in contact with a second main surface side of the first impurity diffusion region. The first contact hole is formed so as to penetrate the interlayer insulating film and to expose the second impurity diffusion region from the first contact hole. The second contact hole is formed so as to penetrate the interlayer insulating film and to expose the polysilicon film from the second contact hole. In the step of forming the first contact hole and the second contact hole, first etching, second etching, and third etching are performed. The second etching is performed after the first etching. The third etching is performed after the second etching. After the first etching is performed and before the second etching is performed, the first main surface is exposed from the first contact hole, and the interlayer insulating film remains in a bottom surface of the second contact hole. After the second etching is performed and before the third etching is performed, the second impurity diffusion region is exposed from the first contact hole, and the interlayer insulating film remains in the bottom surface of the second contact hole. After the third etching is performed, the polysilicon film is exposed from the second contact hole.

The manufacturing method of the semiconductor device according to the embodiment can reduce the manufacturing cost for forming the first contact hole and the second contact hole while preventing the second contact hole from penetrating the polysilicon film.

BRIEF DESCRIPTIONS OF THE DRAWINGS

FIG. 21 is a cross-sectional view of a semiconductor device DEV1a.

FIG. 22 is a plan view of the semiconductor device DEV1a.

FIG. 36 is a cross-sectional view of a semiconductor device DEV2a.

FIG. 37 is a process diagram illustrating a manufacturing method of the semiconductor device DEV2a.

FIG. 38 is a cross-sectional view for explaining a second trench forming step S19 of the manufacturing method of the semiconductor device DEV2a.

FIG. 39 is a cross-sectional view for explaining a first trench forming step S4 of the manufacturing method of the semiconductor device DEV2a.

FIG. 40 is a cross-sectional view for explaining a first polysilicon film forming step S6 of the manufacturing method of the semiconductor device DEV2a.

DETAILED DESCRIPTION

Details of embodiments of the present invention will be described with reference to the accompanying drawings. The same or similar components are denoted by the same reference signs throughout all the drawings described below, and the repetitive description thereof will be omitted.

First Embodiment

A semiconductor device according to a first embodiment will be described. The semiconductor device according to the first embodiment is a semiconductor device DEV1.

<Configuration of Semiconductor Device Dev 1>

Hereinafter, the configuration of the semiconductor device DEV1 will be described.

Figure 1:
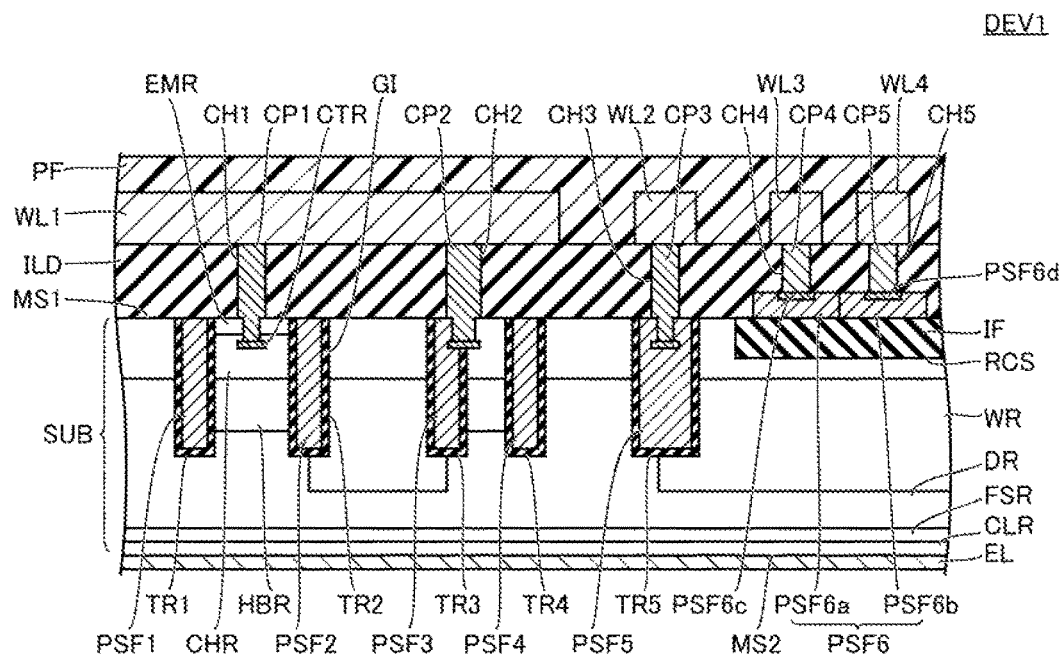
FIG. 1 is a cross-sectional view of a semiconductor device DEV1.

FIG. 1 is a cross-sectional view of the semiconductor device DEV1. As illustrated in FIG. 1, the semiconductor device DEV1 includes a semiconductor substrate SUB, a gate insulating film GI, a polysilicon film PSF1, a polysilicon film PSF2, a polysilicon film PSF3, a polysilicon film PSF4, and a polysilicon film PSF5, an insulating film IF, a polysilicon film PSF6, and an interlayer insulating film ILD. The semiconductor device DEV1 includes a contact plug CP1, a contact plug CP2, a contact plug CP3, a contact plug CP4, and a contact plug CP5, wiring WL1, wiring WL2, wiring WL3, and wiring WL4, a polyimide film PF, and an electrode EL.

The semiconductor substrate SUB has a first main surface MS1 and a second main surface MS2. The first main surface MS1 and the second main surface MS2 are end surfaces of the semiconductor substrate SUB in a thickness direction. The second main surface MS2 is a surface opposite to the first main surface MS1. The semiconductor substrate SUB is made of, for example, single-crystal silicon (Si).

A trench TR1, a trench TR2, a trench TR3, a trench TR4, and a trench TR5 are formed in the first main surface MS1. The trench TR1, the trench TR2, the trench TR3, the trench TR4, and the trench TR5 extend toward the second main surface MS2. The trench TR1 and the trench TR2 are adjacent to each other. The trench TR3 and the trench TR4 are adjacent to each other. The trench TR3 and the trench TR4 are disposed between the trench TR2 and the trench TR5. The trench TR2 is closer to the trench TR3 than the trench TR1. The trench TR4 is closer to the trench TR5 than the trench TR3.

The semiconductor substrate SUB includes a collector region CLR, a field stop region FSR, a drift region DR, a channel region CHR, an emitter region EMR, a contact region CTR, a hole barrier region HBR, and a well region WR.

The collector region CLR is formed in the second main surface MS2. The field stop region FSR is disposed on the collector region CLR. The drift region DR is disposed on the field stop region FSR. The channel region CHR is formed in the first main surface MS1. Between the trench TR1 and the trench TR2, the emitter region EMR is disposed in the first main surface MS1, and the channel region CHR is in contact with the second main surface MS2 side of the emitter region EMR.

The contact region CTR is disposed in the channel region CHR between the trench TR1 and the trench TR2. Between the trench TR1 and the trench TR2 and between the trench TR3 and the trench TR4, the hole barrier region HBR is disposed between the drift region DR and the channel region CHR. Between the trench TR2 and the trench TR3, the well region WR is disposed between the drift region DR and the channel region CHR. Outside the trench TR5 (on the side opposite to the trench TR4), the well region WR is also disposed between the drift region DR and the channel region CHR.

The conductivity types of the field stop region FSR, the drift region DR, the hole barrier region HBR, and the emitter region EMR are n-type. The conductivity types of the collector region CLR, the channel region CHR, the contact region CTR, and the well region WR are p-type. The dopant concentration in the emitter region EMR is higher than the dopant concentration in the field stop region FSR. The dopant concentration in the field stop region FSR is higher than the dopant concentration in the drift region DR. The dopant concentration in the hole barrier region HBR is higher than the dopant concentration in the drift region DR. The dopant concentrations in the collector region CLR and in the contact region CTR are higher than the dopant concentration in the channel region CHR. The dopant concentration in the channel region CHR is higher than the dopant concentration in the well region WR.

The polysilicon film PSF1, the polysilicon film PSF2, the polysilicon film PSF3, the polysilicon film PSF4, and the polysilicon film PSF5 are embedded in the trench TR1, the trench TR2, the trench TR3, the trench TR4, and the trench TR5, respectively. The polysilicon film PSF1, the polysilicon film PSF2, the polysilicon film PSF3, the polysilicon film PSF4, and the polysilicon film PSF5 are made of polysilicon containing an n-type dopant.

The gate insulating film GI is disposed between the polysilicon film PSF1 and the side surface and bottom surface of the trench TR1. Similarly, the gate insulating film GI is also disposed between the polysilicon film PSF2 and the side surfaces and bottom surface of the trench TR2, between the polysilicon film PSF3 and the side surfaces and bottom surface of the trench TR3, between the polysilicon film PSF4 and the side surfaces and bottom surface of the trench TR4, and between the polysilicon film PSF5 and the side surfaces and bottom surface of the trench TR5. The gate insulating film GI is made of, for example, silicon oxide ($SiO_2$).

The emitter region EMR, the channel region CHR, and the hole barrier region HBR are exposed from the side surfaces of the trench TR1 and the trench TR2. The polysilicon film PSF1 and the polysilicon film PSF2 face a portion of the channel region CHR sandwiched between the emitter region EMR and the hole barrier region HBR so as to interpose the gate insulating film GI therebetween. From another point of view, this is said that the polysilicon film PSF1 and the polysilicon film PSF2 are gates of the IGBT. Although not illustrated, the polysilicon film PSF1 and the polysilicon film PSF2 are connected to the polysilicon film PSF5.

The insulating film IF is disposed on the first main surface MS1. More specifically, a recess RCS is formed in first main surface MS1. At the recess RCS, the first main surface MS1 is recessed toward the second main surface MS2. The insulating film IF is embedded in the recess RCS. Note that the recess RCS is disposed outside the trench TR5. That is, the insulating film IF has a recess LOCal Oxidation of Silicon (LOCOS) structure.

The polysilicon film PSF6 is disposed on the insulating film IF. The polysilicon film PSF6 is made of polysilicon containing a dopant. The polysilicon film PSF6 includes a first portion PSF6a and a second portion PSF6b. The first portion PSF6a includes a contact section PSF6c, and the second portion PSF6b includes a contact section PSF6d.

The first portion PSF6a and the second portion PSF6b have different conductivity types. For example, the conductivity type of the first portion PSF6a is p-type, and the conductivity type of the second portion PSF6b is n-type. Therefore, the first portion PSF6a and the second portion PSF6b form a p-n junction, and the polysilicon film PSF6 is a diode.

The contact section PSF6c and the contact section PSF6d are in the upper surface of the polysilicon film PSF6 in the first portion PSF6a and the upper surface of the polysilicon film PSF6 in the second portion PSF6b, respectively. The dopant concentration in the contact section PSF6c is higher than the dopant concentration in the first portion PSF6a. The conductivity type of the contact section PSF6c is the same as the conductivity type of the first portion PSF6a. The dopant concentration in the contact section PSF6d is higher than the dopant concentration in the second portion PSF6b. The conductivity type of the contact section PSF6d is the same as the conductivity type of the second portion PSF6b.

The interlayer insulating film ILD is disposed on the first main surface MS1 so as to cover the insulating film IF and the polysilicon film PSF6. The interlayer insulating film ILD is made of, for example, silicon oxide. The upper surface of the interlayer insulating film ILD is planarized. A contact hole CH1, a contact hole CH2, a contact hole CH3, a contact hole CH4, and a contact hole CH5 are formed in the interlayer insulating film ILD.

The contact hole CH1 penetrates the interlayer insulating film ILD. The lower end of the contact hole CH1 reaches the channel region CHR between the trench TR1 and the trench TR2. The contact hole CH2 penetrates the interlayer insulating film ILD. The lower end of the contact hole CH2 reaches the polysilicon film PSF3 and the channel region CHR between the trench TR3 and the trench TR4.

The contact hole CH3 penetrates the interlayer insulating film ILD. The lower end of the contact hole CH3 reaches the polysilicon film PSF5. Note that the contact region CTR is exposed from the bottom surface of the contact hole CH1, the bottom surface of the contact hole CH2, and the contact hole CH3.

The contact hole CH4 penetrates the interlayer insulating film ILD. The contact section PSF6c is exposed from the contact hole CH4. The contact hole CH5 penetrates the interlayer insulating film ILD. The contact section PSF6d is exposed from the contact hole CH5. A barrier metal not illustrated may be disposed on the inner wall surfaces of the contact hole CH1, the contact hole CH2, the contact hole CH3, and the contact hole CH4. The barrier metal is made of titanium (Ti), titanium nitride (TiN), or the like.

Figure 2:
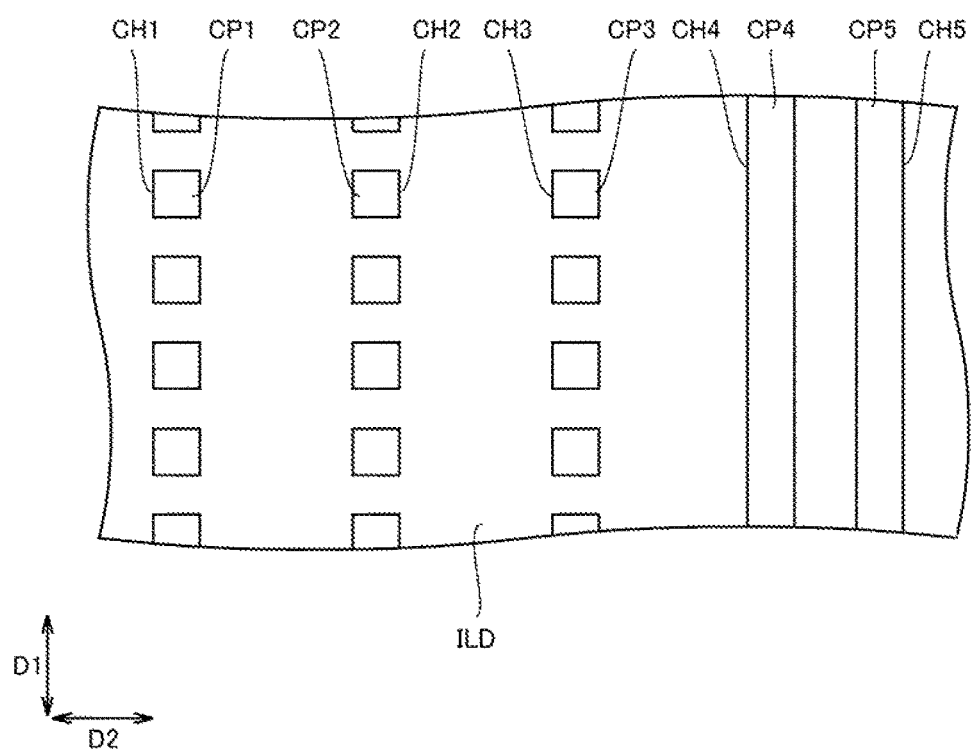
FIG. 2 is a plan view of the semiconductor device DEV1.

FIG. 2 is a plan view of the semiconductor device DEV1. In FIG. 2, illustration of the wiring WL1, the wiring WL2, the wiring WL3, and the wiring WL4, and the polyimide film PF is omitted. As illustrated in FIG. 2, the number of the contact holes CH1 is plural, and each of the plurality of contact holes CH1 has a rectangular shape in plan view. Each of the plurality of contact holes CH1 aligns on a line along a first direction D1 in plan view. The same applies to the contact hole CH2 and the contact hole CH3.

The contact hole CH4 extends along the first direction D1 in plan view. The opening area of the contact hole CH4 in plan view is larger than the opening area of the contact hole CH1 (the contact hole CH2 or the contact hole CH3) in plan view. The same applies to the contact hole CH5.

As illustrated in FIG. 1, the contact plug CP1 is embedded in the contact hole CH1. The lower end of the contact plug CP1 is electrically connected to the emitter region EMR, and to the channel region CHR between the trench TR1 and the trench TR2. The contact plug CP2 is embedded in the contact hole CH2. The lower end of the contact plug CP2 is electrically connected to the channel region CHR between the trench TR3 and the trench TR4, and to the polysilicon film PSF3.

The contact plug CP3 is embedded in the contact hole CH3. The lower end of the contact plug CP3 is electrically connected to the polysilicon film PSF5. The contact plug CP4 is embedded in the contact hole CH4. The contact plug CP5 is embedded in the contact hole CH5. The lower end of the contact plug CP4 and the lower end of the contact plug CP5 are electrically connected to the first portion PSF6a and the second portion PSF6b, respectively. That is, the lower end of the contact plug CP4 and the lower end of the contact plug CP5 are electrically connected to the diode. The contact plug CP1, the contact plug CP2, the contact plug CP3, the contact plug CP4, and the contact plug CP5 are made of, for example, tungsten (W).

The wiring WL1 is disposed on the interlayer insulating film ILD. The wiring WL1 is electrically connected to the upper end of the contact plug CP1 and the upper end of the contact plug CP2. The wiring WL1 is at an emitter potential. Therefore, the emitter region EMR, the channel region CHR between the trench TR1 and the trench TR2, the channel region CHR between the trench TR3 and the trench TR4, and the polysilicon film PSF3 are also at the emitter potential.

The wiring WL2 is disposed on the interlayer insulating film ILD. The wiring WL2 is electrically connected to the upper end of the contact plug CP3. The wiring WL2 is at a gate potential. Therefore, the polysilicon film PSF5, the polysilicon film PSF1, and the polysilicon film PSF2 are also at the gate potential. The wiring WL3 and the wiring WL4 are disposed on the interlayer insulating film ILD. The wiring WL3 and the wiring WL4 are electrically connected to the upper end of the contact plug CP4 and the upper end of the contact plug CP5, respectively. The wiring WL1, the wiring WL2, the wiring WL3, and the wiring WL4 are made of, for example, an aluminum (Al) alloy.

The polyimide film PF is disposed on the interlayer insulating film ILD so as to cover the wiring WL1, the wiring WL2, the wiring WL3, and the wiring WL4. Although not illustrated, each of the wiring WL1, the wiring WL2, the wiring WL3, and the wiring WL4 includes an electrode pad section, and openings for exposing the electrode pad sections are formed in the polyimide film PF. The electrode EL is disposed on the second main surface MS2. The electrode EL is electrically connected to the collector region CLR. The electrode EL is made of, for example, an aluminum alloy.

<Manufacturing Method of Semiconductor Device DEV1>

Hereinafter, a manufacturing method of the semiconductor device DEV1 will be described.

Figure 3:
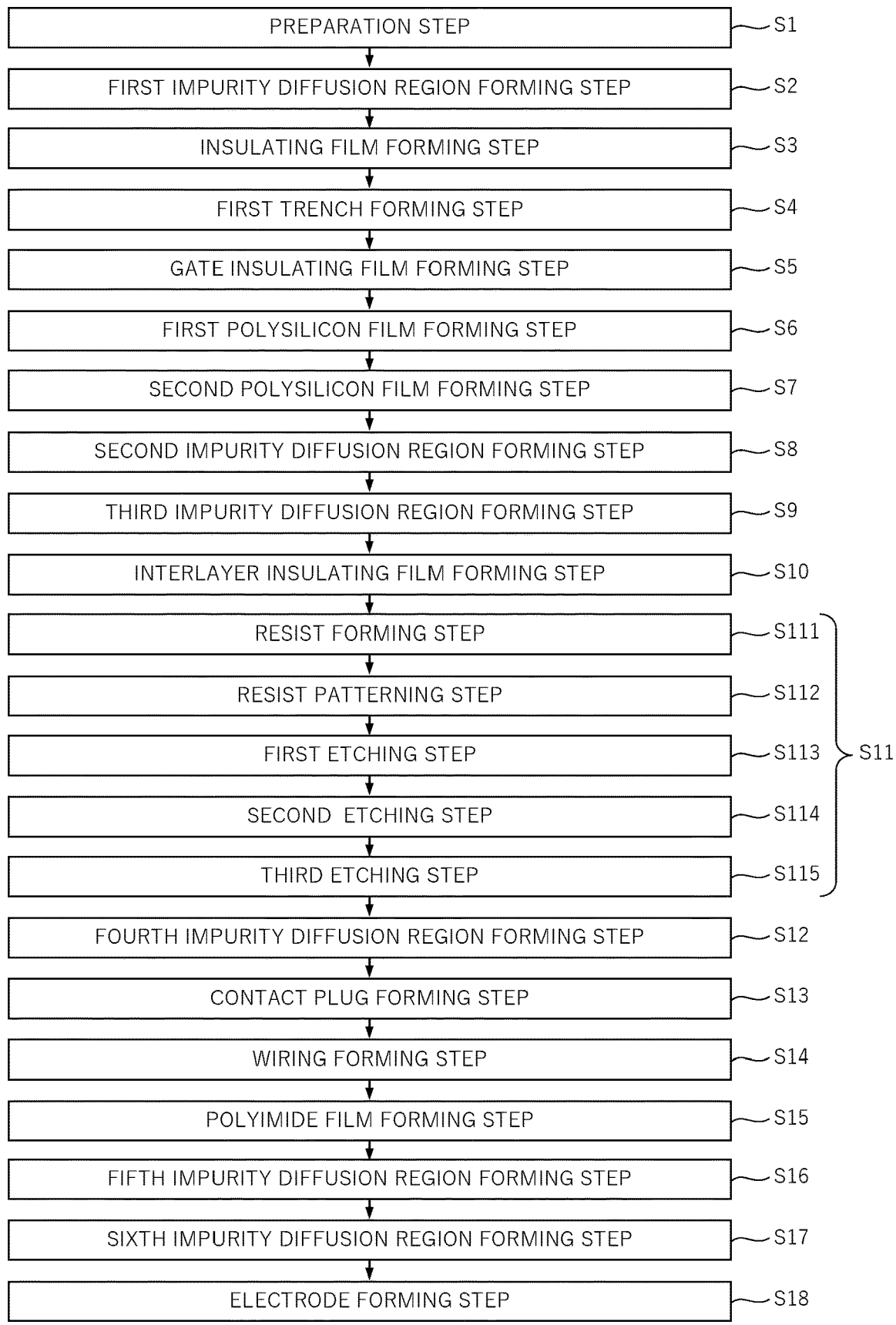
FIG. 3 is a process diagram illustrating a manufacturing method of the semiconductor device DEV1.

FIG. 3 is a process diagram illustrating the manufacturing method of the semiconductor device DEV1. As illustrated in FIG. 3, the manufacturing method of the semiconductor device DEV1 includes a preparation step S1, a first impurity diffusion region forming step S2, an insulating film forming step S3, a first trench forming step S4, a gate insulating film forming step S5, a first polysilicon film forming step S6, a second polysilicon film forming step S7, a second impurity diffusion region forming step S8, a third impurity diffusion region forming step S9, an interlayer insulating film forming step S10, a contact hole forming step S11, a fourth impurity diffusion region forming step S12, a contact plug forming step S13, a wiring forming step S14, a polyimide film forming step S15, a fifth impurity diffusion region forming step S16, a sixth impurity diffusion region forming step S17, and an electrode forming step S18.

Figure 4:
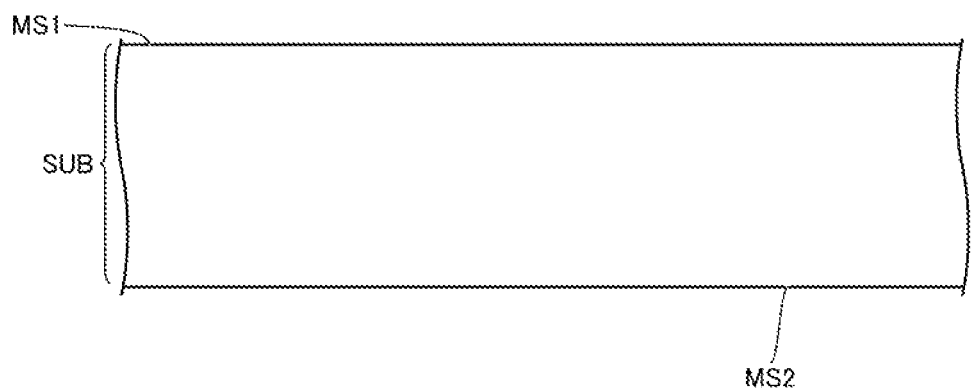
FIG. 4 is a cross-sectional view for explaining a preparation step S1.
Figure 5:
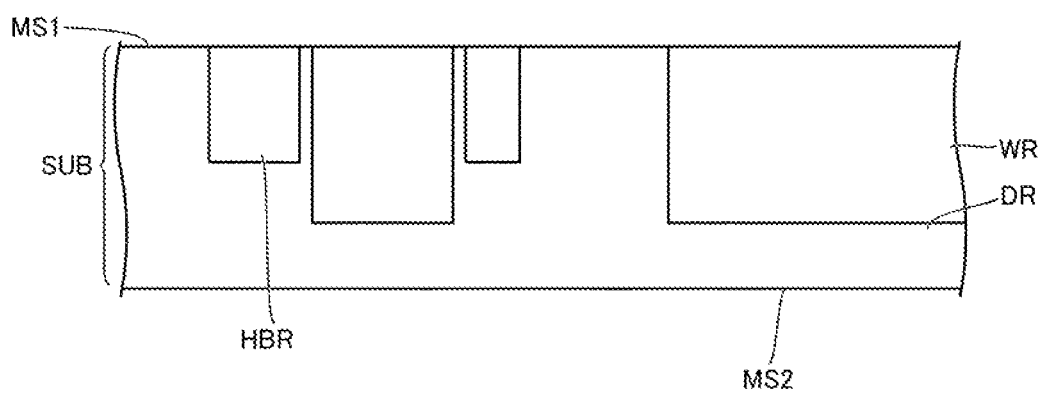
FIG. 5 is a cross-sectional view for explaining a first impurity diffusion region forming step S2.

FIG. 4 is a cross-sectional view for explaining the preparation step S1. As illustrated in FIG. 4, in the preparation step S1, a semiconductor substrate SUB is prepared. FIG. 5 is a cross-sectional view for explaining the first impurity diffusion region forming step S2. As illustrated in FIG. 5, in the first impurity diffusion region forming step S2, a hole barrier region HBR and a well region WR are formed. In the first impurity diffusion region forming step S2, first, ion implantation is performed on a portion of the semiconductor substrate SUB where the hole barrier region HBR is to be formed, the portion being closer to the first main surface MS1, and on a portion of the semiconductor substrate SUB where the well region WR is to be formed, the portion being closer to the first main surface MS1. During this ion implantation, a resist is disposed on a portion of the semiconductor substrate SUB where the hole barrier region HBR and the well region WR are not to be formed, the portion being closer to the first main surface MS1. This resist is removed after the above-described ion implantation is performed. Second, heat treatment is performed to the semiconductor substrate SUB. Consequently, an implanted dopant diffuses toward the second main surface MS2 side, and the hole barrier region HBR and the well region WR are formed.

Figure 6:
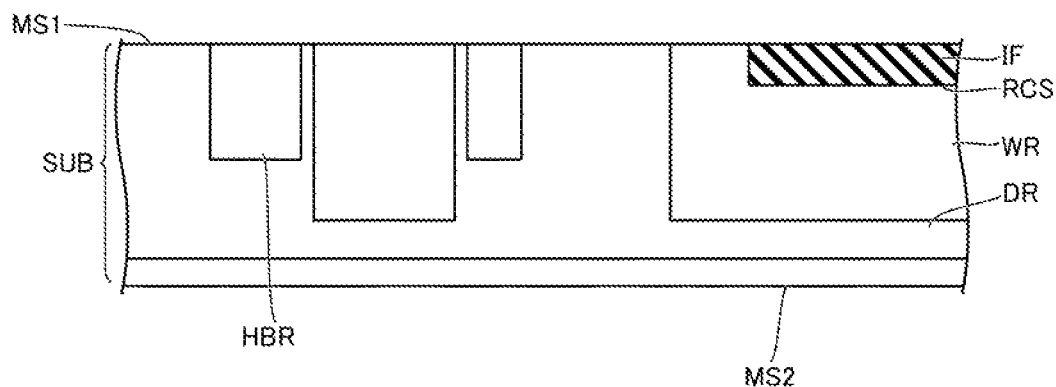
FIG. 6 is a cross-sectional view for explaining an insulating film forming step S3.

FIG. 6 is a cross-sectional view for explaining the insulating film forming step S3. As illustrated in FIG. 6, in the insulating film forming step S3, a recess RCS is formed, and an insulating film IF is embedded in the recess RCS. In the insulating film forming step S3, first, the recess RCS is formed by etching a portion of the semiconductor substrate SUB, the portion being closer to the first main surface MS1. This etching is performed using, for example, a hard mask made of a silicon oxide film disposed on the first main surface MS1 and a silicon nitride (SiN) film disposed on this silicon oxide film. In the hard mask, an opening for exposing the first main surface MS1 is formed at a portion where the recess RCS is formed. Second, thermal oxidation is performed to a portion of the semiconductor substrate SUB, the portion being closer to the first main surface MS1, so that the recess RCS is filled with the insulating film IF. Note that the above-described hard mask is removed after the insulating film IF is formed.

Figure 7:
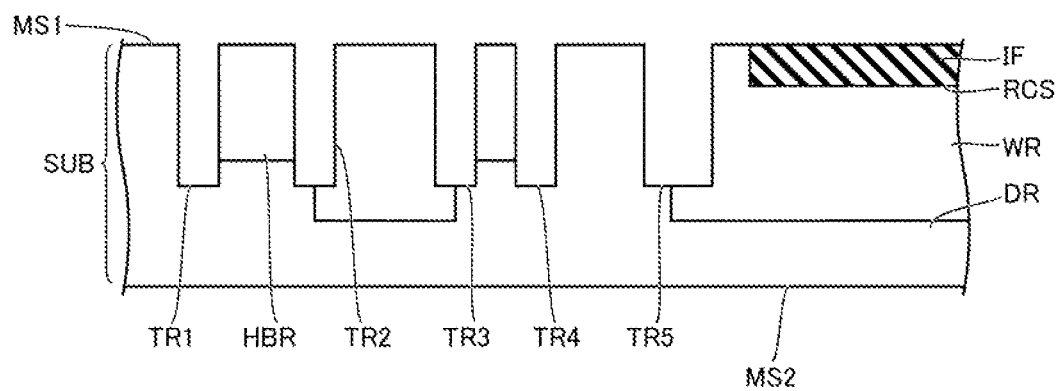
FIG. 7 is a cross-sectional view for explaining a first trench forming step S4.

FIG. 7 is a cross-sectional view for explaining the first trench forming step S4. As illustrated in FIG. 7, in the first trench forming step S4, a trench TR1, a trench TR2, a trench TR3, a trench TR4, and a trench TR5 are formed by etching on a portion of the semiconductor substrate SUB, the portion being closer to the first main surface MS1. This etching is performed using, for example, a hard mask made of a silicon oxide film disposed on the first main surface MS1 and a silicon nitride film disposed on this silicon oxide film. In this hard mask, openings for exposing the first main surface MS1 are formed at portions where the trench TR1, the trench TR2, the trench TR3, the trench TR4, and the trench TR5 are formed. Note that the above-described hard mask is removed after the trench TR1, the trench TR2, the trench TR3, the trench TR4, and the trench TR5 are formed.

Figure 8:
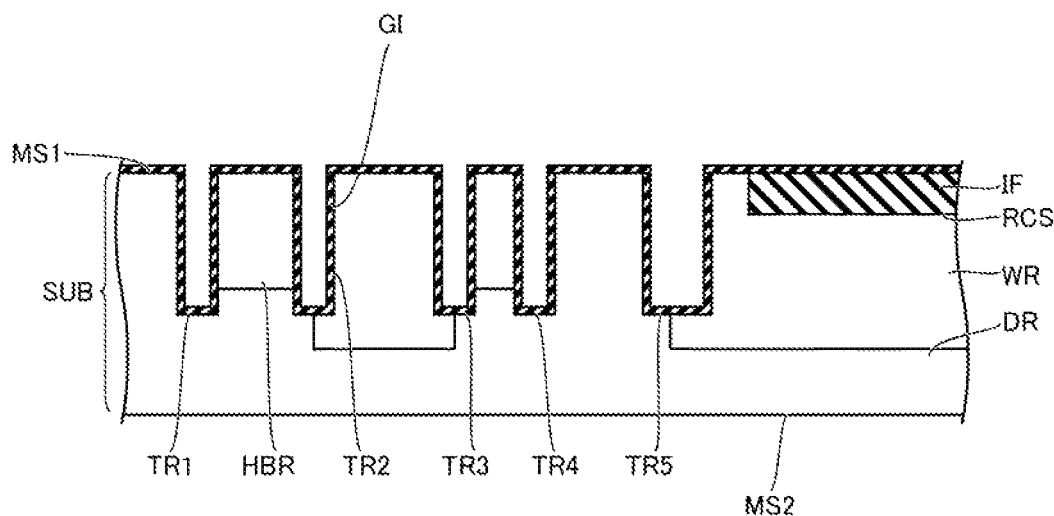
FIG. 8 is a cross-sectional view for explaining a gate insulating film forming step S5.

FIG. 8 is a cross-sectional view for explaining the gate insulating film forming step S5. As illustrated in FIG. 8, in the gate insulating film forming step S5, a gate insulating film GI is formed on the inner wall surfaces (side surfaces and bottom surfaces) of the trench TR1, the trench TR2, the trench TR3, the trench TR4, and the trench TR5 by thermal oxidization on a portion of the semiconductor substrate SUB, the portion being closer to the first main surface MS1.

Figure 9:
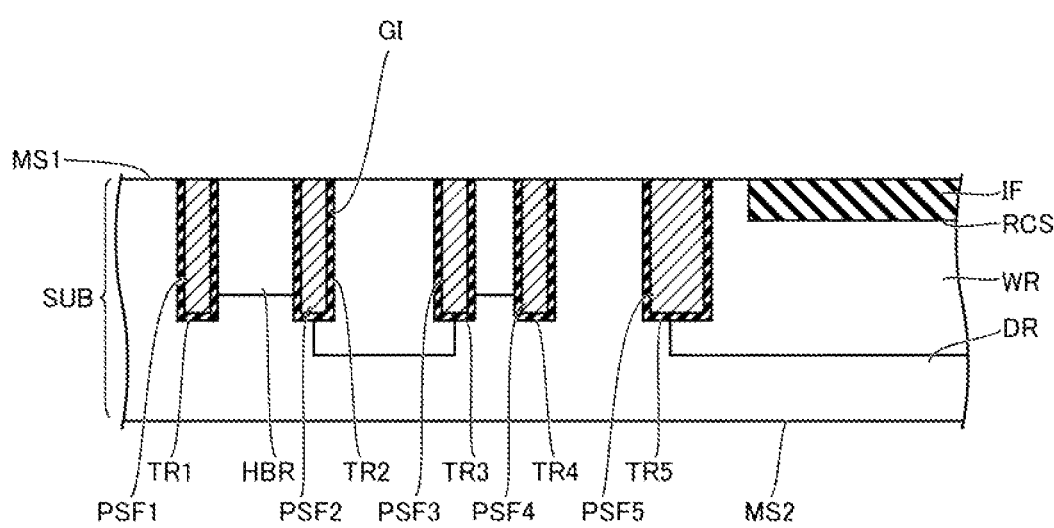
FIG. 9 is a cross-sectional view for explaining a first polysilicon film forming step S6.

FIG. 9 is a cross-sectional view for explaining the first polysilicon film forming step S6. As illustrated in FIG. 9, in the first polysilicon film forming step S6, a polysilicon film PSF1, a polysilicon film PSF2, a polysilicon film PSF3, a polysilicon film PSF4, and a polysilicon film PSF5 are formed. In the first polysilicon film forming step S6, first, polysilicon is embedded in the trench TR1, the trench TR2, the trench TR3, the trench TR4, and the trench TR5. This polysilicon is embedded by, for example, chemical vapor deposition (CVD). The polysilicon contains a dopant. Second, the polysilicon protruding from the trench TR1, the trench TR2, the trench TR3, the trench TR4, and the trench TR5 is removed by, for example, the CMP.

Figure 10:
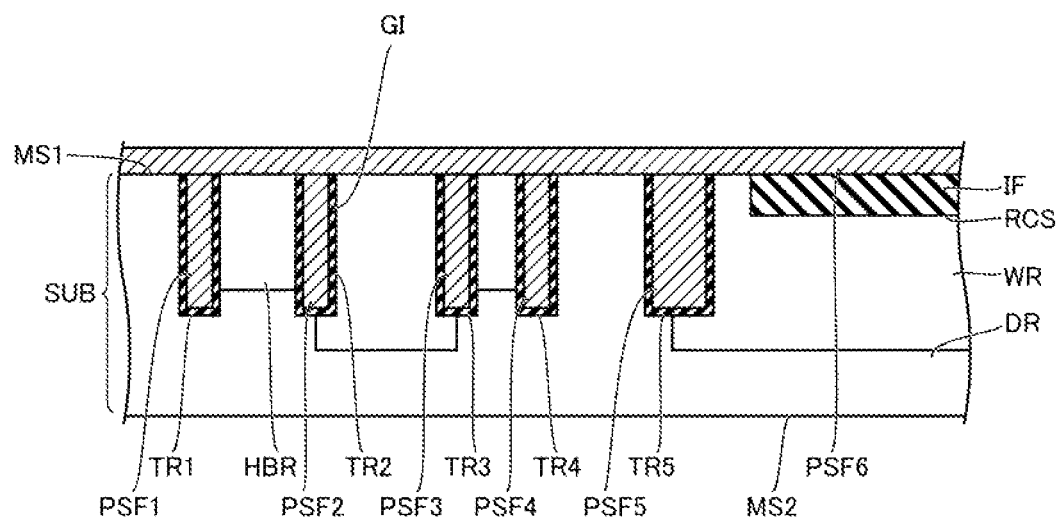
FIG. 10 is a cross-sectional view for explaining a second polysilicon film forming step S7.

FIG. 10 is a cross-sectional view for explaining the second polysilicon film forming step S7. As illustrated in FIG. 10, in the second polysilicon film forming step S7, a polysilicon film PSF6 is formed on the first main surface MS1 so as to cover the insulating film IF. At this stage, the polysilicon film PSF6 does not contain a dopant.

Figure 11:
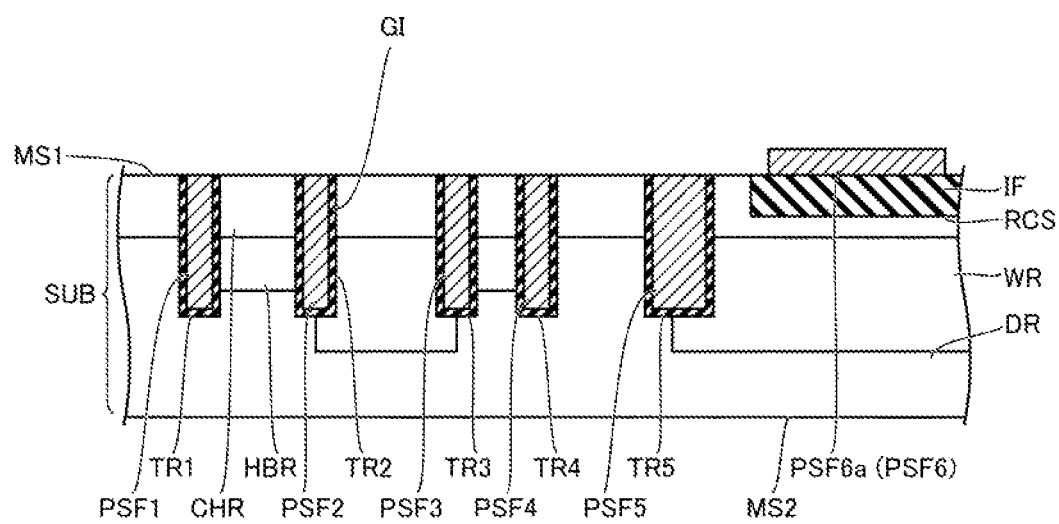
FIG. 11 is a cross-sectional view for explaining a second impurity diffusion region forming step S8.

FIG. 11 is a cross-sectional view for explaining the second impurity diffusion region forming step S8. As illustrated in FIG. 11, in the second impurity diffusion region forming step S8, first, a channel region CHR is formed by ion implantation. Furthermore, in this ion implantation, the dopant is also implanted into the polysilicon film PSF6. Second, the polysilicon film PSF6 is patterned. This patterning is performed by etching using a resist patterned by photolithography as a mask.

Figure 12:
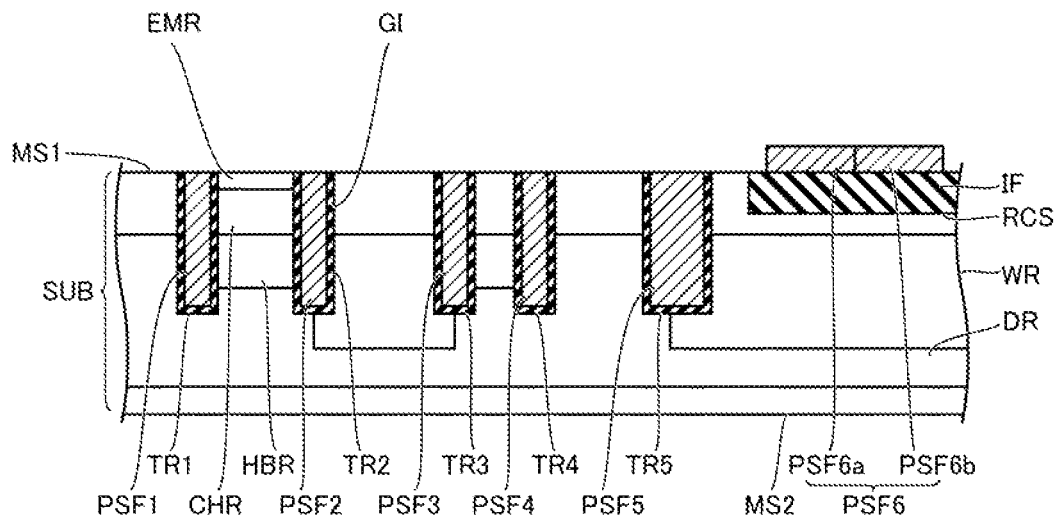
FIG. 12 is a cross-sectional view for explaining a third impurity diffusion region forming step S9.

FIG. 12 is a cross-sectional view for explaining the third impurity diffusion region forming step S9. As illustrated in FIG. 12, in the third impurity diffusion region forming step S9, an emitter region EMR is formed by ion implantation. In this ion implantation, a dopant is also implanted into a portion of the polysilicon film PSF6 to be a second section PSF6*b*. A portion of the polysilicon film PSF6 into which the dopant is not implanted at this stage becomes a first portion PSF6*a*. In this ion implantation, a resist is disposed on the first main surface MS1 of a portion of the semiconductor substrate SUB where the emitter region EMR is not to be formed, and on a portion of the polysilicon film PSF6 where the second portion PSF6*b* is not to be formed. This resist is removed after the above-described ion implantation is performed.

Figure 13:
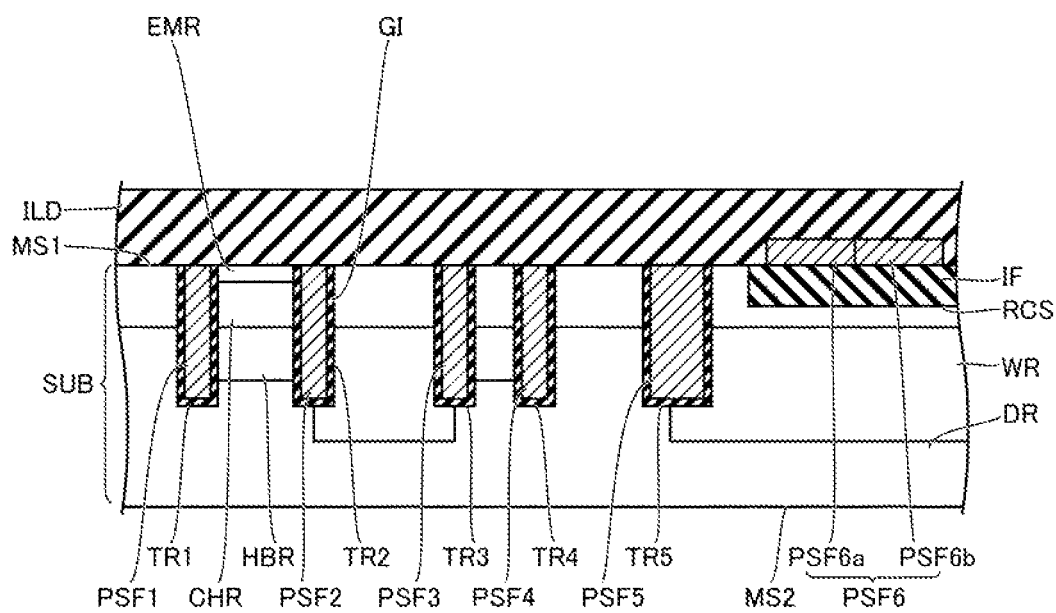
FIG. 13 is a cross-sectional view for explaining an interlayer insulating film forming step S10.

FIG. 13 is a cross-sectional view for explaining the interlayer insulating film forming step S10. As illustrated in FIG. 13, in the interlayer insulating film forming step S10, an interlayer insulating film ILD is formed. In the interlayer insulating film forming step S10, first, a film made of a constituent material (silicon oxide) of the interlayer insulating film ILD is formed on the first main surface MS1 by, for example, CVD so as to cover the polysilicon film PSF6 and the insulating film IF. Second, the formed silicon oxide is planarized by CMP or the like.

As illustrated in FIG. 3, the contact hole forming step S11 includes a resist forming step S111, a resist patterning step S112, a first etching step S113, a second etching step S114, and a third etching step S115.

Figure 14A:
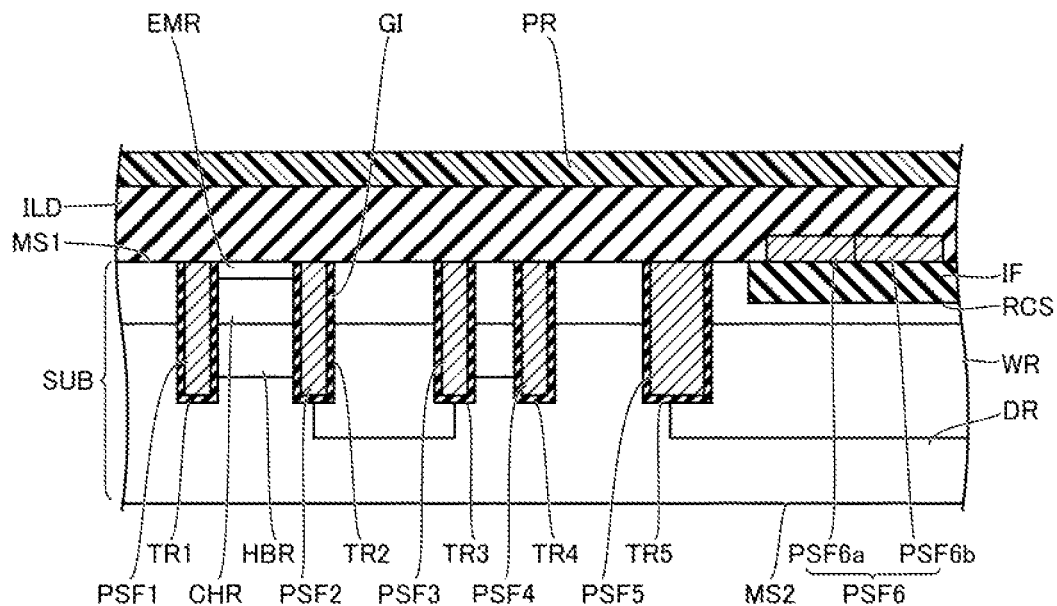
FIG. 14A is a cross-sectional view for explaining a resist forming step S111.
Figure 14B:
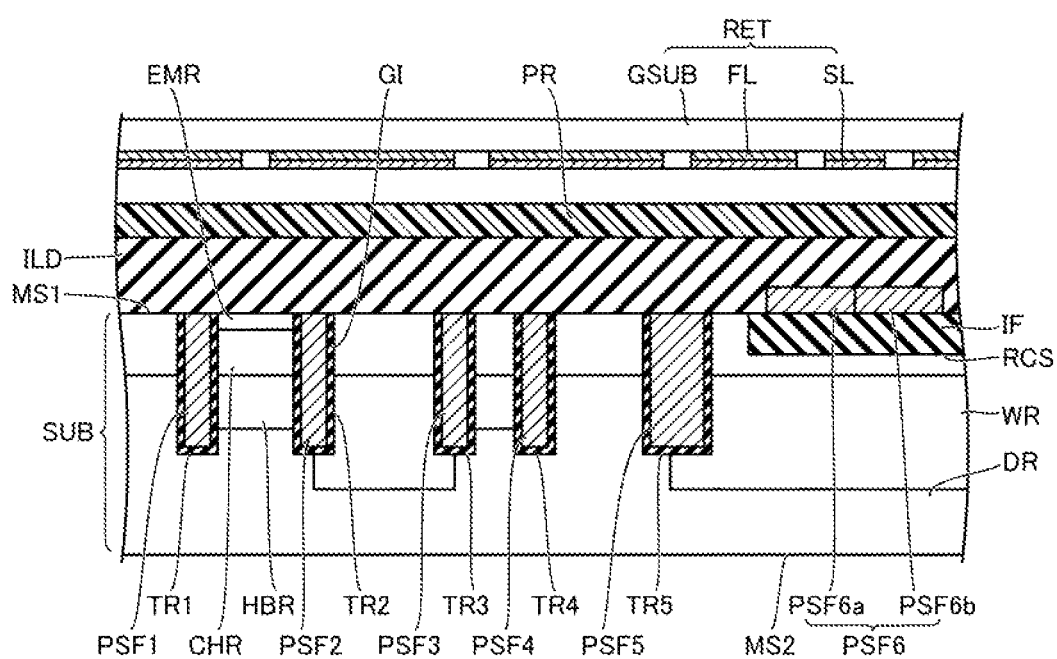
FIG. 14B is a first cross-sectional view for explaining a resist patterning step S112.

FIG. 14A is a cross-sectional view for explaining the resist forming step S111. As illustrated in FIG. 14A, in the resist forming step S111, a resist PR is formed on the interlayer insulating film ILD. FIG. 14B is a first cross-sectional view for explaining the resist patterning step S112. As illustrated in FIG. 14B, in the resist patterning step S112, the resist PR is exposed using a reticle RET. The reticle RET includes a glass substrate GSUB, a first layer FL, and a second layer SL. The first layer FL is disposed on the glass substrate GSUB, and the second layer SL is disposed on the first layer FL. The first layer FL and the second layer SL are made of molybdenum silicide (MoSi) and chromium (Cr), respectively. The reticle RET has portions from which the first layer FL and the second layer SL are removed, and the resist PR is exposed by light having transmitted through the portions.

Figure 14C:
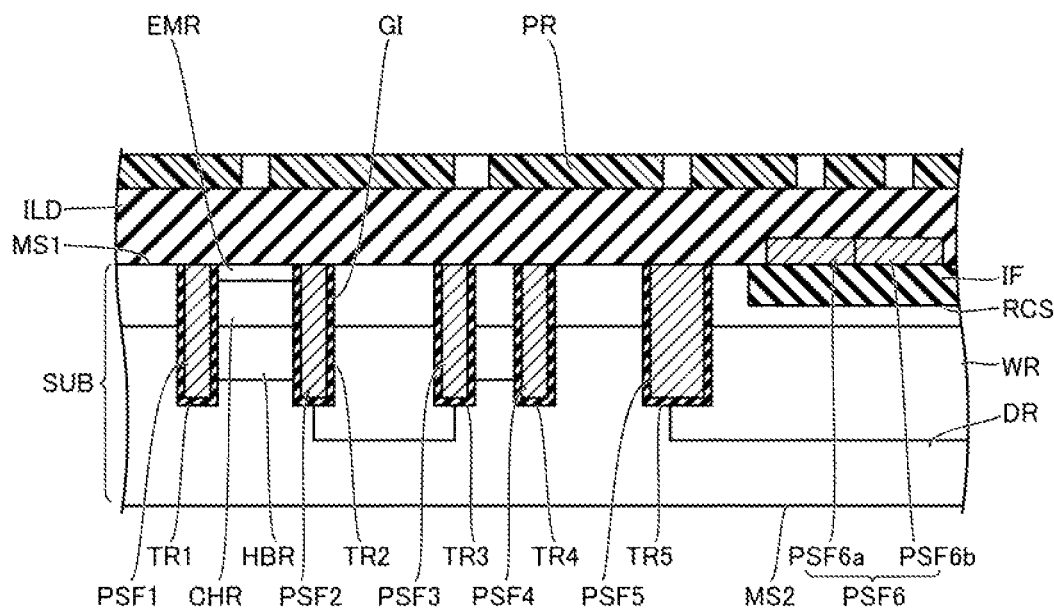
FIG. 14C is a second cross-sectional view for explaining the resist patterning step S112.

FIG. 14C is a second cross-sectional view for explaining the resist patterning step S112. As illustrated in FIG. 14C, in the resist patterning step S112, second, the exposed PR is developed. Consequently, the resist PR is patterned so as to open at positions corresponding to a contact hole CH1, a contact hole CH2, a contact hole CH3, a contact hole CH4, and a contact hole CH5.

Figure 14D:
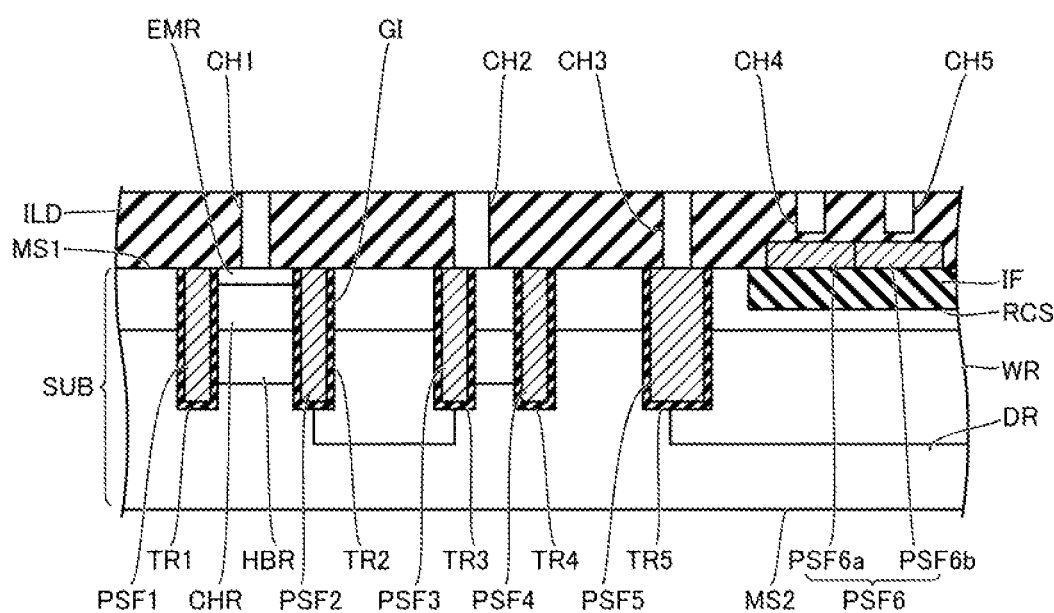
FIG. 14D is a cross-sectional view for explaining a first etching step S113.

FIG. 14D is a cross-sectional view for explaining the first etching step S113. As illustrated in FIG. 14D, in the first etching step S113, the contact hole CH1, the contact hole CH2, the contact hole CH3, the contact hole CH4 and the contact hole CH5 are formed in the interlayer insulating film ILD. The etching conditions in the first etching step S113 are set such that the deposition amount during the etching increases as the opening area of the contact hole to be etched increases. Therefore, after the first etching step S113 is performed, the contact hole CH1, the contact hole CH2, and the contact hole CH3 penetrate the interlayer insulating film ILD, but the contact hole CH4 and the contact hole CH5 do not penetrate the interlayer insulating film ILD.

More specifically, the etching gas used for this etching is a fluorocarbon-based gas (CF gas). The C/F ratio of the etching gas is set to be equal to or higher than 0.5. The etching gas is, for example, hexafluorobutadiene ($C_4F_6$), octafluorocyclobutane ($C_4F_8$), or octafluorocyclopentene ($C_5F_8$). Furthermore, the etching gas is used together with argon (Ar) and oxygen ($O_2$). When the first etching step S113 is performed, the temperature of the semiconductor substrate SUB is set to be equal to or lower than 20° C.

Figure 14E:
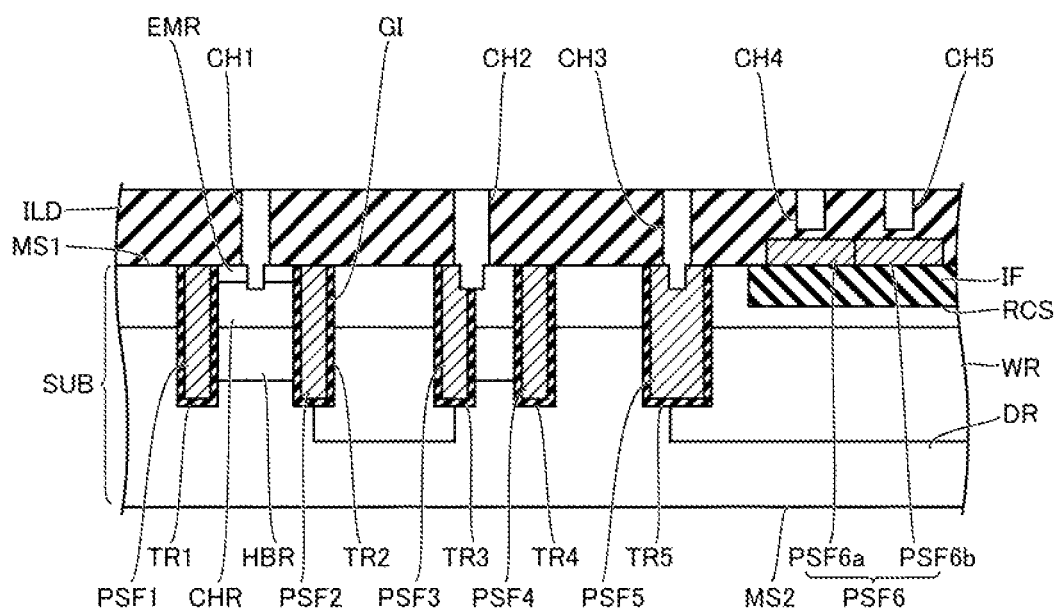
FIG. 14E is a cross-sectional view for explaining a second etching step S114.

FIG. 14E is a cross-sectional view for explaining the second etching step S114. As illustrated in FIG. 14E, in the second etching step S114, the contact hole CH1 extends so as to reach the channel region CHR between the trench TR1 and the trench TR2. Furthermore, in the second etching step S114, the contact hole CH2 extends so as to reach the channel region CHR between the trench TR3 and the trench TR4 and reach the polysilicon film PSF3, and the contact hole CH3 extends so as to reach the polysilicon film PSF5. However, since an etching gas having a high etch selectivity to the interlayer insulating film ILD is used for the etching in the second etching step S114, the contact hole CH4 and the contact hole CH5 do not penetrate the interlayer insulating film ILD after the second etching step S114 is performed. The above-described etching gas is, for example, sulfur hexafluoride ($SF_6$).

Figure 14F:
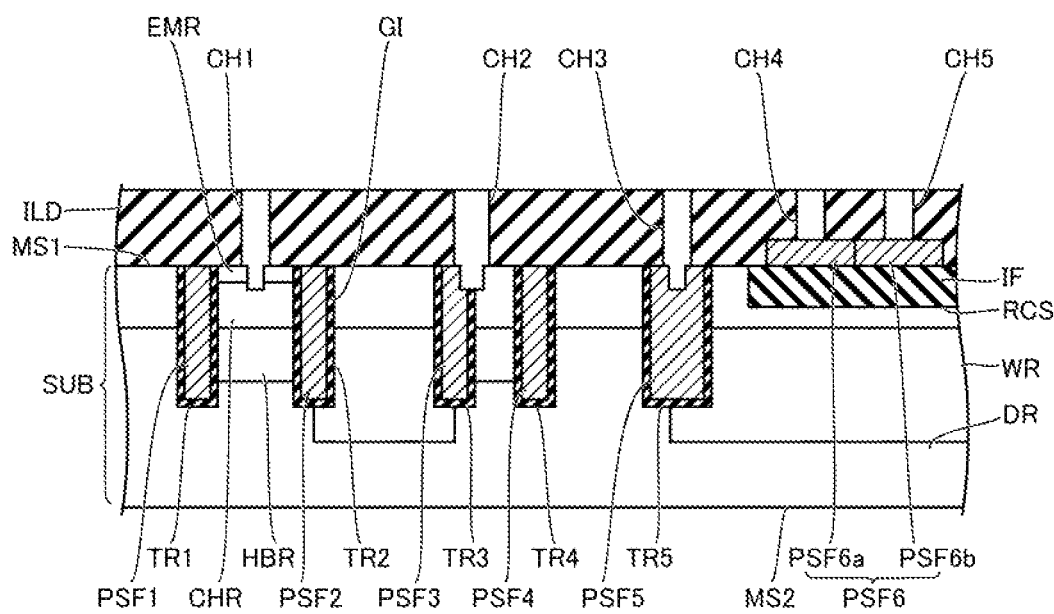
FIG. 14F is a cross-sectional view for explaining a third etching step S115.

FIG. 14F is a cross-sectional view for explaining the third etching step S115. As illustrated in FIG. 14F, in the third etching step S115, the contact hole CH4 and the contact hole CH5 extend toward the polysilicon film PSF6, and penetrate the interlayer insulating film ILD. As the etching gas in the third etching step S115, an etching gas such as tetrafluoromethane ($CF_4$) having a low deposition property during etching is used. This etching gas is used together with argon.

Figure 15:
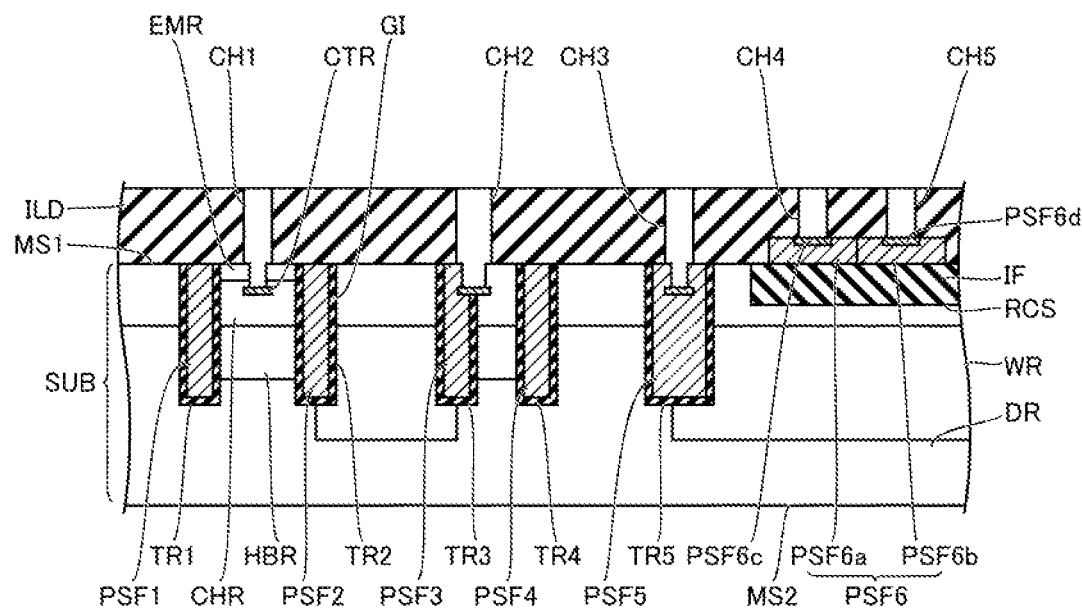
FIG. 15 is a cross-sectional view for explaining a fourth impurity diffusion region forming step S12.

FIG. 15 is a cross-sectional view for explaining the fourth impurity diffusion region forming step S12. As illustrated in FIG. 15, in the fourth impurity diffusion region forming step S12, a contact region CTR is formed in the channel region CHR exposed from the contact hole CH1. The contact region CTR is also formed in the channel region CHR and the polysilicon film PSF3 exposed from the contact hole CH2, and in the polysilicon film PSF5 exposed from the contact hole CH3. Furthermore, in the fourth impurity diffusion region forming step S12, a contact section PSF6c and a contact section PSF6d are also formed. The contact region CTR, the contact section PSF6c, and the contact section PSF6d are formed by ion implantation.

Figure 16:
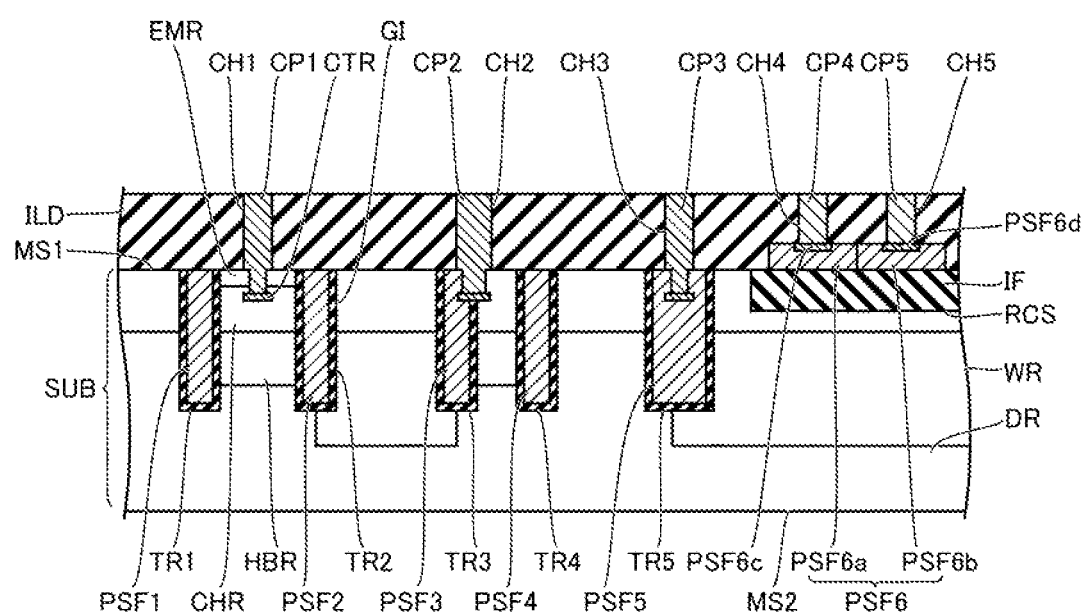
FIG. 16 is a cross-sectional view for explaining a contact plug forming step S13.

FIG. 16 is a cross-sectional view for explaining the contact plug forming step S13. As illustrated in FIG. 16, in the contact plug forming step S13, a contact plug CP1, a contact plug CP2, a contact plug CP3, a contact plug CP4, and a contact plug CP5 are formed. In the contact plug forming step S13, the constituent material (tungsten) of the contact plug CP1, the contact plug CP2, the contact plug CP3, the contact plug CP4, and the contact plug CP5 are embedded in the contact hole CH1, the contact hole CH2, the contact hole CH3, the contact hole CH4, and the contact hole CH5 by, for example, CVD. Second, the tungsten protruding from the contact hole CH1, the contact hole CH2, the contact hole CH3, the contact hole CH4, and the contact hole CH5 is removed by, for example, CMP.

Figure 17:
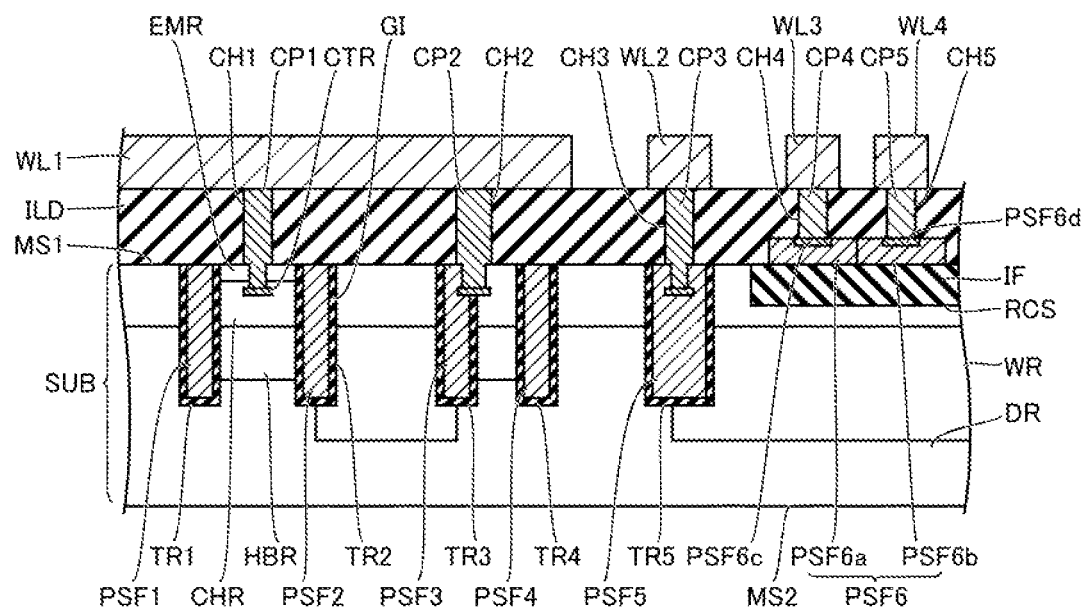
FIG. 17 is a cross-sectional view for explaining a wiring forming step S14.

FIG. 17 is a cross-sectional view for explaining the wiring forming step S14. As illustrated in FIG. 17, in the wiring forming step S14, wiring WL1, wiring WL2, wiring WL3, and wiring WL4 are formed. In the wiring forming step S14, first, the constituent material (aluminum alloy) of the wiring WL1, the wiring WL2, the wiring WL3, and the wiring WL4 is formed on the interlayer insulating film ILD by sputtering or the like. Second, the formed aluminum alloy is patterned by etching using a resist formed by photolithography as a mask.

Figure 18:
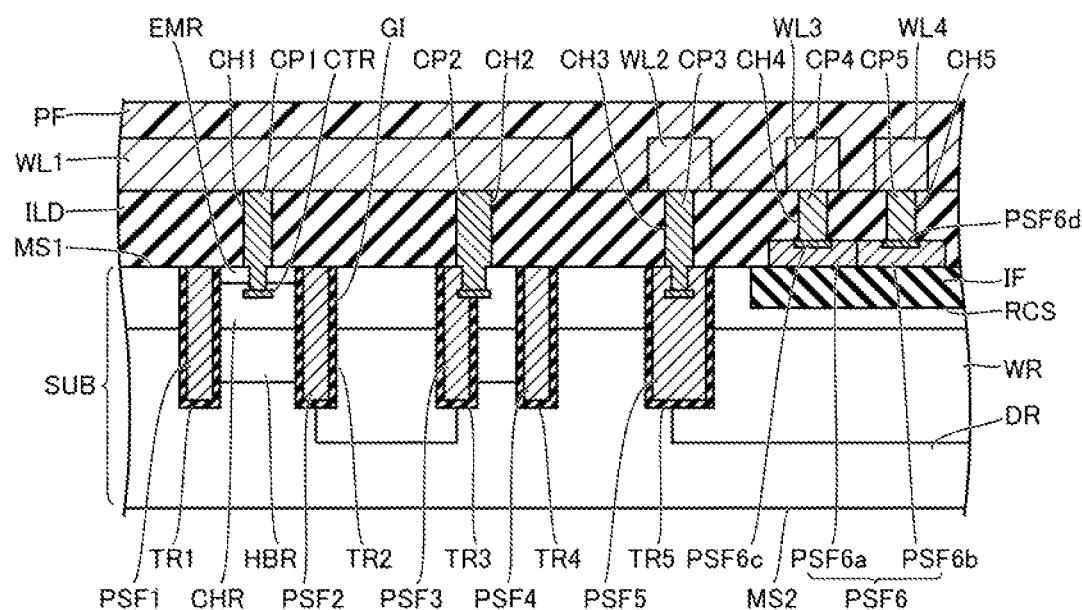
FIG. 18 is a cross-sectional view for explaining a polyimide film forming step S15.

FIG. 18 is a cross-sectional view for explaining the polyimide film forming step S15. As illustrated in FIG. 18, in the polyimide film forming step S15, a polyimide film PF is formed on the interlayer insulating film ILD so as to cover the wiring WL1, the wiring WL2, the wiring WL3, and the wiring WL4. Openings for exposing the electrode pad sections of the wiring WL1, the wiring WL2, the wiring WL3, and the wiring WL4 are formed in the polyimide film PF by patterning using photolithography after the polyimide film PF is formed.

Figure 19:
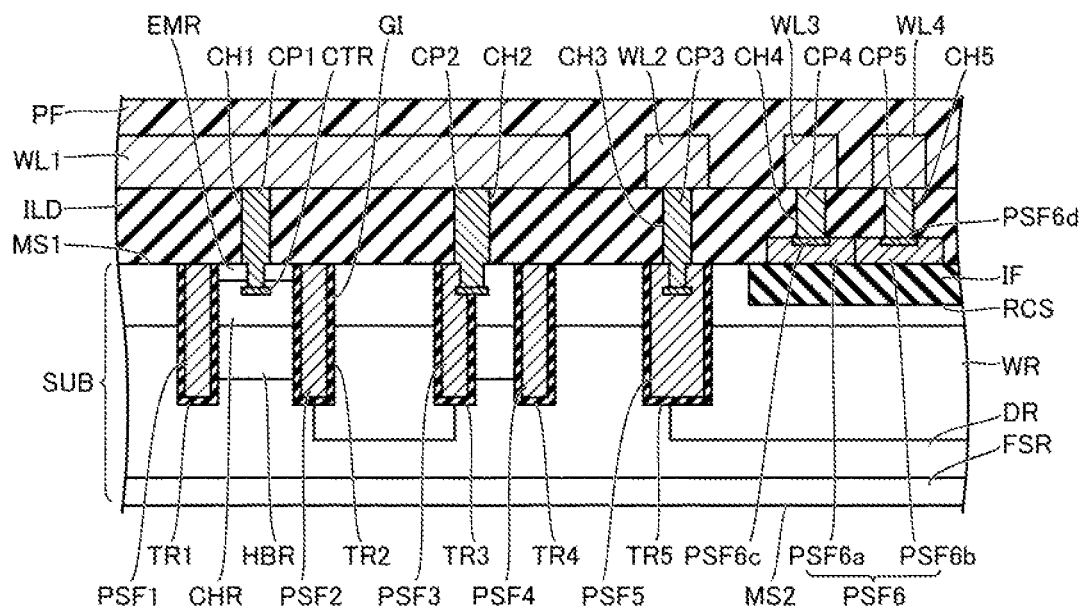
FIG. 19 is a cross-sectional view for explaining a fifth impurity diffusion region forming step S16.
Figure 20:
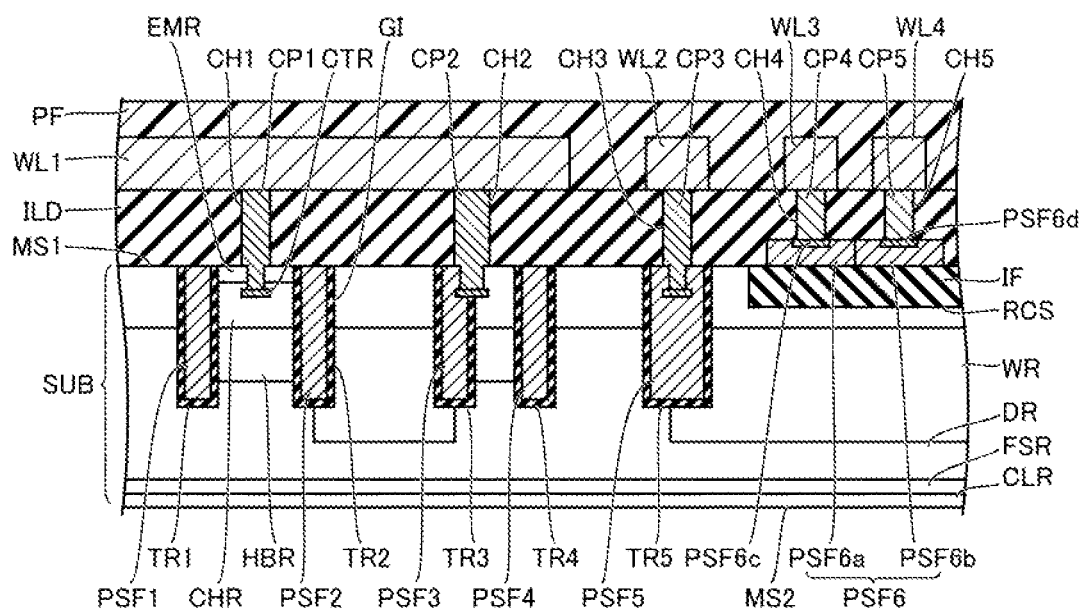
FIG. 20 is a cross-sectional view for explaining a sixth impurity diffusion region forming step S17.

FIG. 19 is a cross-sectional view for explaining the fifth impurity diffusion region forming step S16. FIG. 20 is a cross-sectional view for explaining the sixth impurity diffusion region forming step S17. As illustrated in FIGS. 19 and 20, a field stop region FSR is formed in a second main surface MS2 in the fifth impurity diffusion region forming step S16, and a collector region CLR is formed in the second main surface MS2 in the sixth impurity diffusion region forming step S17. The field stop region FSR and the collector region CLR are formed by ion implantation on the second main surface MS2 side.

In the electrode forming step S18, an electrode EL is formed on the second main surface MS2. The electrode EL is formed by, for example, sputtering. As described above, the semiconductor device DEV1 having the structure illustrated in FIGS. 1 and 2 is formed.

<Effects of Manufacturing Method of Semiconductor Device DEV1>

As described above, in the manufacturing method of the semiconductor device DEV1, the resist for forming the contact hole CH1, the contact hole CH2, the contact hole CH3, the contact hole CH4, and the contact hole CH5 is formed only once. Therefore, according to the manufacturing method of the semiconductor device DEV1, it is possible to reduce the manufacturing cost for forming the contact hole CH1, the contact hole CH2, the contact hole CH3, the contact hole CH4, and the contact hole CH5.

Furthermore, in the manufacturing method of the semiconductor device DEV1, the second etching step S114 is performed in a state of the polysilicon film PSF6 not exposed from the contact hole CH4 and the contact hole CH5, and then, the polysilicon film PSF6 is exposed from the contact hole CH4 and the contact hole CH5 by the third etching step S115, and therefore, the contact hole CH4 and the contact hole CH5 are prevented from penetrating the polysilicon film PSF6.

First Modification Example

The semiconductor device DEV1 according to a first modification example is a semiconductor device DEV1a.

Here, the differences from the semiconductor device DEV1 will be mainly described, and repetitive description will not be repeated.

<Configuration of Semiconductor Device DEV1A>

Hereinafter, the configuration of the semiconductor device DEV1a will be described.

Figure 21:
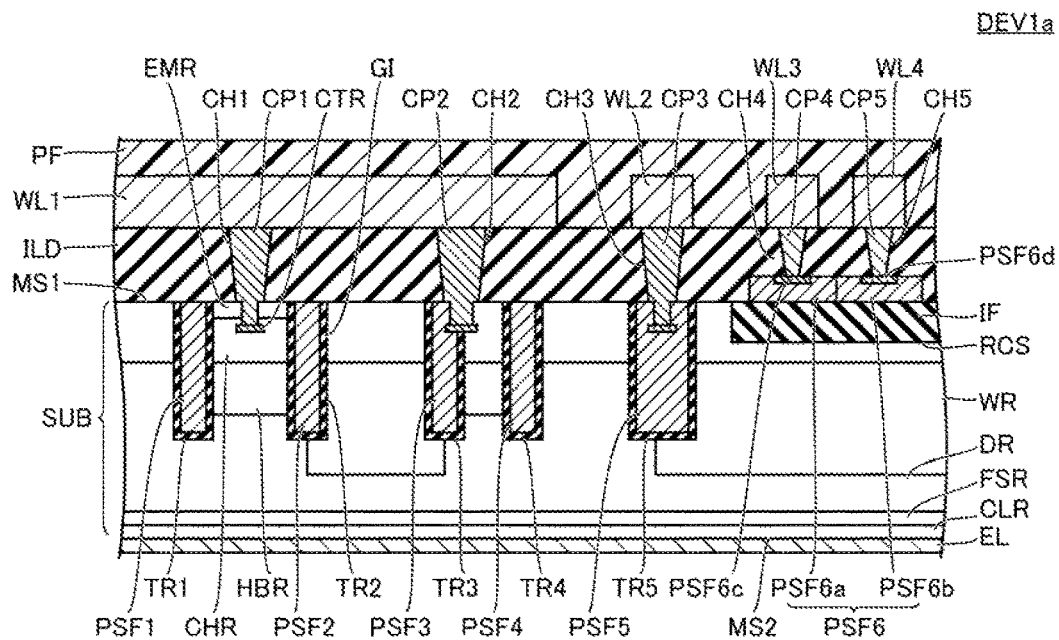
Figure 22:
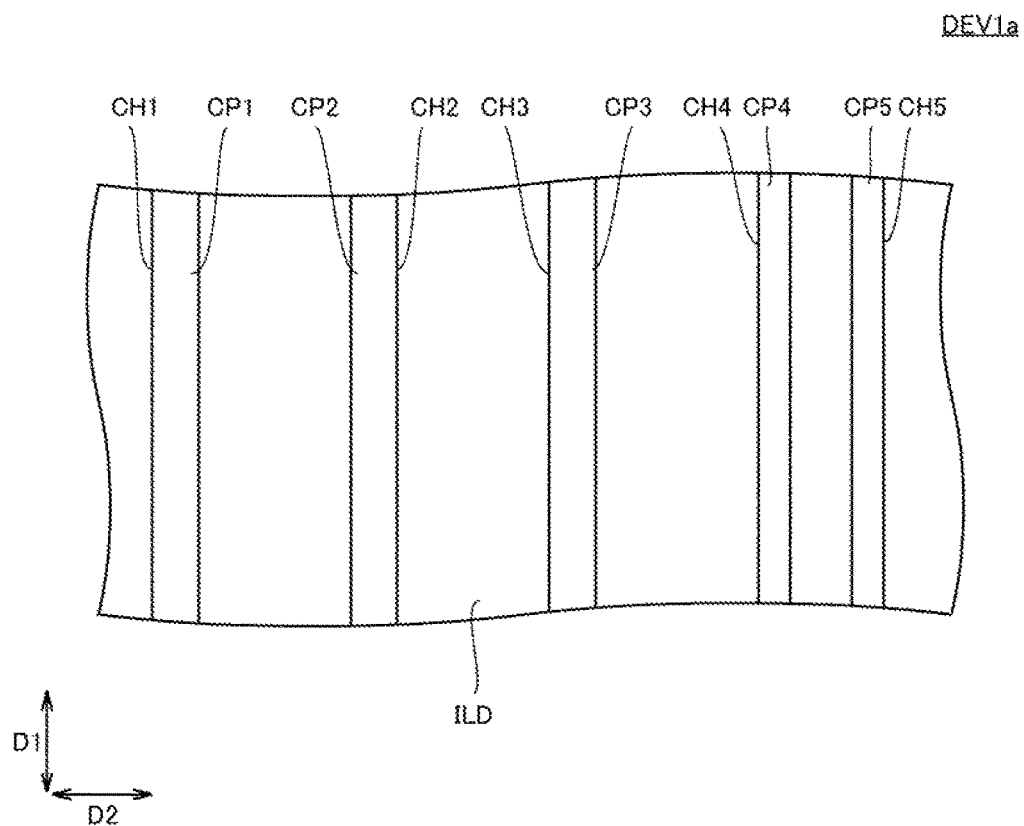

FIG. 21 is a cross-sectional view of the semiconductor device DEV1a. FIG. 22 is a plan view of the semiconductor device DEV1a. In FIG. 22, illustration of wiring WL1, wiring WL2, wiring WL3, and wiring WL4, and a polyimide film PF is omitted. As illustrated in FIGS. 21 and 22, in the semiconductor device DEV1a, a contact hole CH1, a contact hole CH2, a contact hole CH3, a contact hole CH4, and a contact hole CH5 extend along a first direction D1 in plan view.

In the semiconductor device DEV1a, the width of the contact hole CH1 in a second direction D2, the width of the contact hole CH2 in the second direction D2, and the width of the contact hole CH3 in the second direction D2 are larger than the widths of the contact hole CH4 in the second direction D2 and the contact hole CH5 in the second direction D2. The second direction D2 is a direction orthogonal to the first direction D1.

The width of the contact hole CH1 in the second direction D2, the width of the contact hole CH2 in the second direction D2, the width of the contact hole CH3 in the second direction D2, the width of the contact hole CH4 in the second direction D2, and the width of the contact hole CH5 in the second direction D2 decrease as the distance from the upper surface of an interlayer insulating film ILD increases. That is, the contact hole CH1, the contact hole CH2, the contact hole CH3, the contact hole CH4, and the contact hole CH5 are formed in a forward tapered shape. However, a portion of the contact hole CH1 lower than the interlayer insulating film ILD, a portion of the contact hole CH2 lower than the interlayer insulating film ILD, and a portion of the contact hole CH3 lower than the interlayer insulating film ILD may not have the forward tapered shape.

<Manufacturing Method of Semiconductor Device DEV1a>

Hereinafter, a manufacturing method of the semiconductor device DEV1a will be described.

In the manufacturing method of the semiconductor device DEV1a, the etching conditions in a first etching step S113 are selected such that the contact hole CH1, the contact hole CH2, the contact hole CH3, the contact hole CH4, and the contact hole CH5 are formed in the forward tapered shape. Therefore, in the manufacturing method of the semiconductor device DEV1a, the contact hole CH4 and the contact hole CH5 are more likely to be closed more than the contact hole CH1, the contact hole CH2, and the contact hole CH3 in the middle of the first etching step S113. As a result, also in the manufacturing method of the semiconductor device DEV1a, after the first etching step S113 is performed, the contact hole CH1, the contact hole CH2, and the contact hole CH3 penetrate the interlayer insulating film ILD, but the contact hole CH4 and the contact hole CH5 do not penetrate the interlayer insulating film ILD.

More specifically, in the manufacturing method of the semiconductor device DEV1a, the etching gas used in the first etching step S113 is a fluorocarbon-based gas containing hydrogen. The etching gas is, for example, trifluoromethane ($CHF_3$) or difluoromethane ($CH_2F_2$). When such an etching gas is used, since the sticking coefficient of the deposition during the etching is low, deposition easily occurs on the side walls of the contact holes, and the contact hole CH1, the contact hole CH2, the contact hole CH3, the contact hole CH4, and the contact hole CH5 are formed in the forward tapered shape.

<Effects of Manufacturing Method of Semiconductor Device DEV1a>

In the manufacturing method of the semiconductor device DEV1a, the resist for forming the contact hole CH1, the contact hole CH2, the contact hole CH3, the contact hole CH4, and the contact hole CH5 is formed only once as similar to the manufacturing method of the semiconductor device DEV1, and therefore, it is possible to reduce the manufacturing cost for forming the contact hole CH1, the contact hole CH2, the contact hole CH3, the contact hole CH4, and the contact hole CH5.

Second Modification Example

The semiconductor device DEV1 according to a second modification example is a semiconductor device DEV1b. Here, the differences from the semiconductor device DEV1 will be mainly described, and repetitive description will not be repeated.

<Configuration of Semiconductor Device DEV1B>

Hereinafter, the configuration of the semiconductor device DEV1b will be described.

Figure 23:
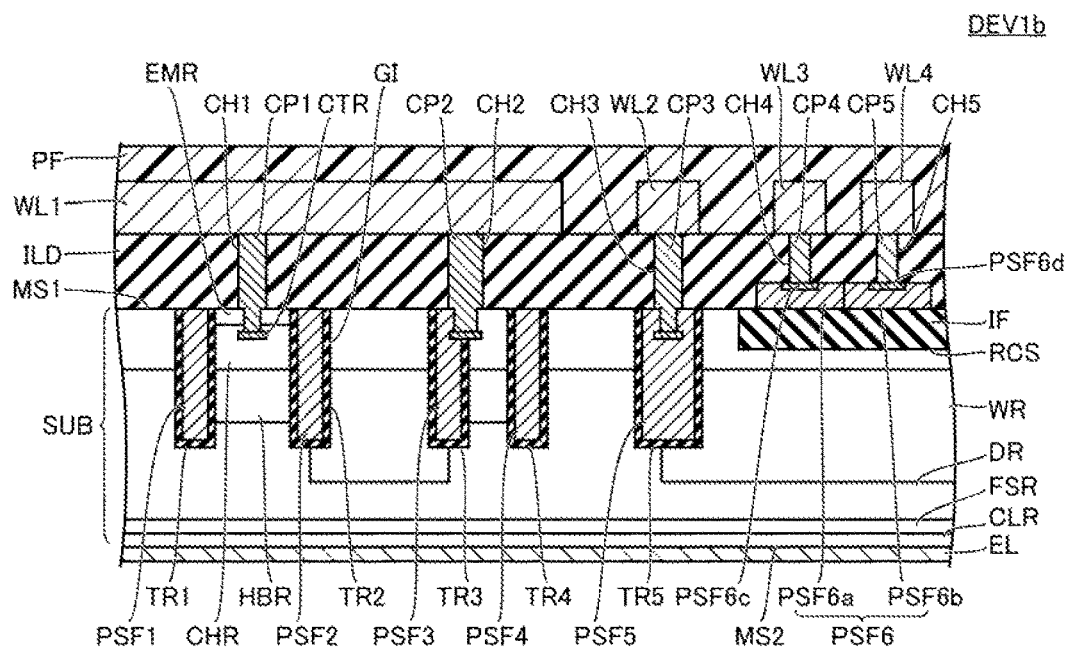
FIG. 23 is a cross-sectional view of a semiconductor device DEV1b.
Figure 24:
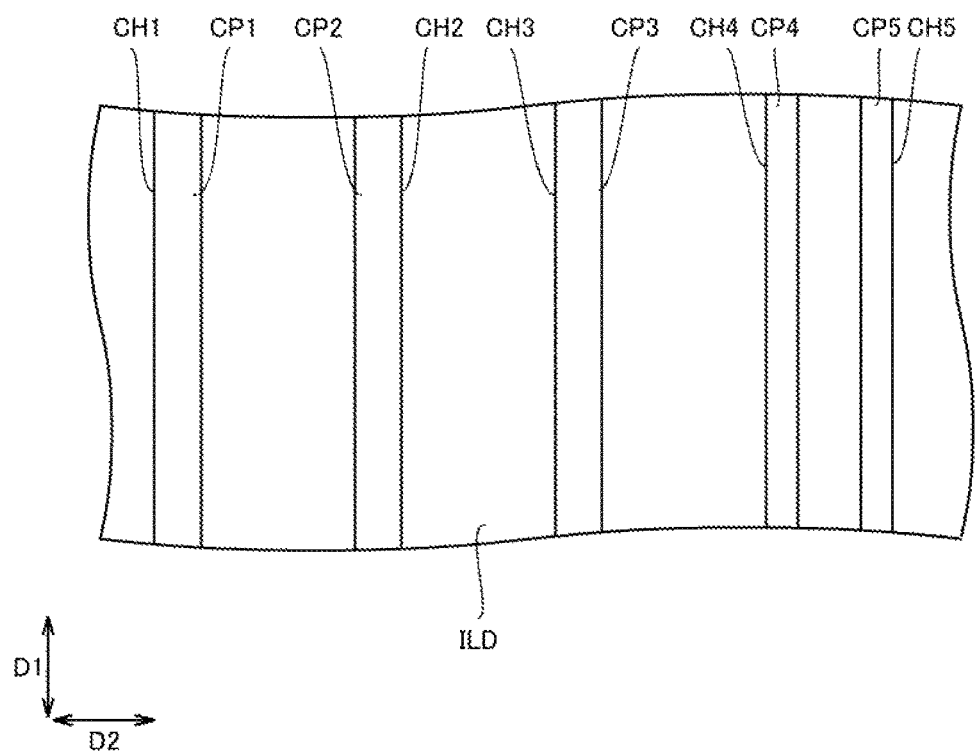
FIG. 24 is a plan view of the semiconductor device DEV1b.

FIG. 23 is a cross-sectional view of the semiconductor device DEV1b. FIG. 24 is a plan view of the semiconductor device DEV1b. In FIG. 24, illustration of wiring WL1, wiring WL2, wiring WL3, and wiring WL4, and a polyimide film PF is omitted. As illustrated in FIGS. 23 and 24, in the semiconductor device DEV1b, a contact hole CH1, a contact hole CH2, a contact hole CH3, a contact hole CH4, and a contact hole CH5 extend along a first direction D1 in plan view.

In the semiconductor device DEV1b, the width of the contact hole CH1 in a second direction D2, the width of the contact hole CH2 in the second direction D2, and the width of the contact hole CH3 in the second direction D2 are larger than the widths of the contact hole CH4 in the second direction D2 and the contact hole CH5 in the second direction D2.

<Manufacturing Method of Semiconductor Device DEV1b>

Hereinafter, a manufacturing method of the semiconductor device DEV1b will be described.

In the manufacturing method of the semiconductor device DEV1b, the etching conditions in a first etching step S113 are selected such that the etching rate decreases as the width of the contact hole CH1 in the second direction D2 (the width of the contact hole CH2 in the second direction D2, the width of the contact hole CH3 in the second direction D2, and the widths of the contact hole CH4 in the second direction D2 and the contact hole CH5 in the second direction D2) decreases. As a result, also in the manufacturing method of the semiconductor device DEV1b, after the first etching step S113 is performed, the contact hole CH1, the contact hole CH2, and the contact hole CH3 penetrate an interlayer insulating film ILD, but the contact hole CH4 and the contact hole CH5 do not penetrate the interlayer insulating film ILD.

More specifically, in the manufacturing method of the semiconductor device DEV1b, the etching gas used in the first etching step S113 is a fluorocarbon-based gas, and the pressure in the chamber during the first etching step S113 is set to be 50 mTorr or higher. The etching gas is, for example, fluoromethane. When such etching conditions are used, the etching gas is less likely to enter a contact hole having a small width in the second direction D2 during the first etching step S113, and therefore, the etching rate for the contact hole CH4 and the contact hole CH5 having a smaller width in the second direction D2 is lower than the etching rate for the contact hole CH1, the contact hole CH2, and the contact hole CH3 having a larger width in the second direction D2.

<Effects of Manufacturing Method of Semiconductor Device DEV1b>

Hereinafter, effects of the manufacturing method of the semiconductor device DEV1b will be described.

In the manufacturing method of the semiconductor device DEV1b, a resist for forming the contact hole CH1, the contact hole CH2, the contact hole CH3, the contact hole CH4, and the contact hole CH5 is formed only once as similar to the manufacturing method of the semiconductor device DEV1, and therefore, it is possible to reduce the manufacturing cost for forming the contact hole CH1, the contact hole CH2, the contact hole CH3, the contact hole CH4, and the contact hole CH5.

Third Modification Example

The semiconductor device DEV1 according to a third modification example is a semiconductor device DEV1c. Here, the differences from the semiconductor device DEV1 will be mainly described, and repetitive description will not be repeated.

<Configuration of Semiconductor Device DEV1c>

Hereinafter, the configuration of the semiconductor device DEV will be described.

Figure 25:
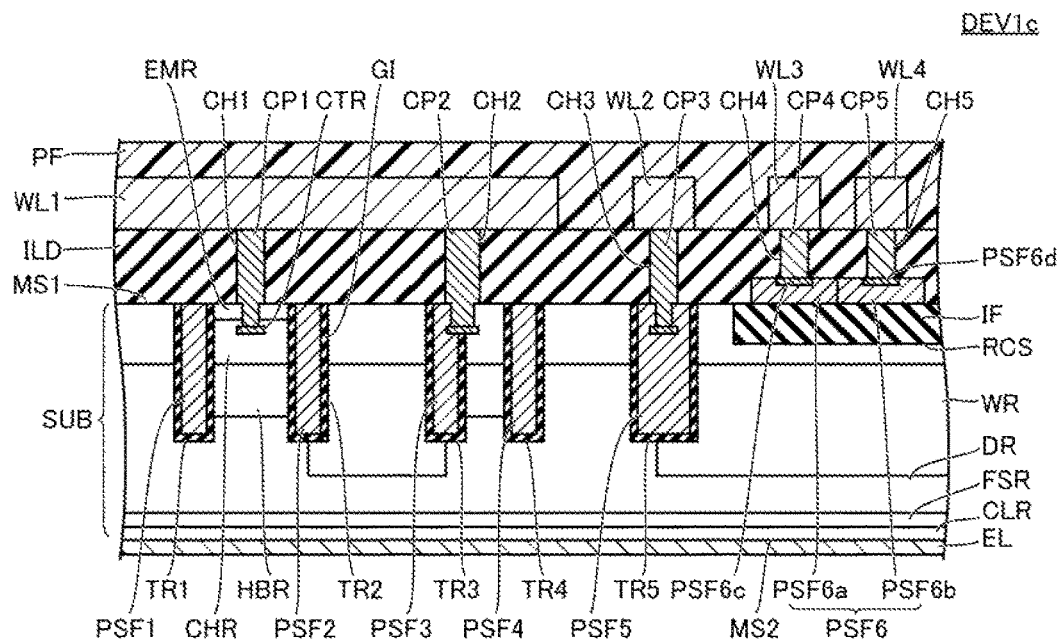
FIG. 25 is a cross-sectional view of a semiconductor device DEV1c.
Figure 26:
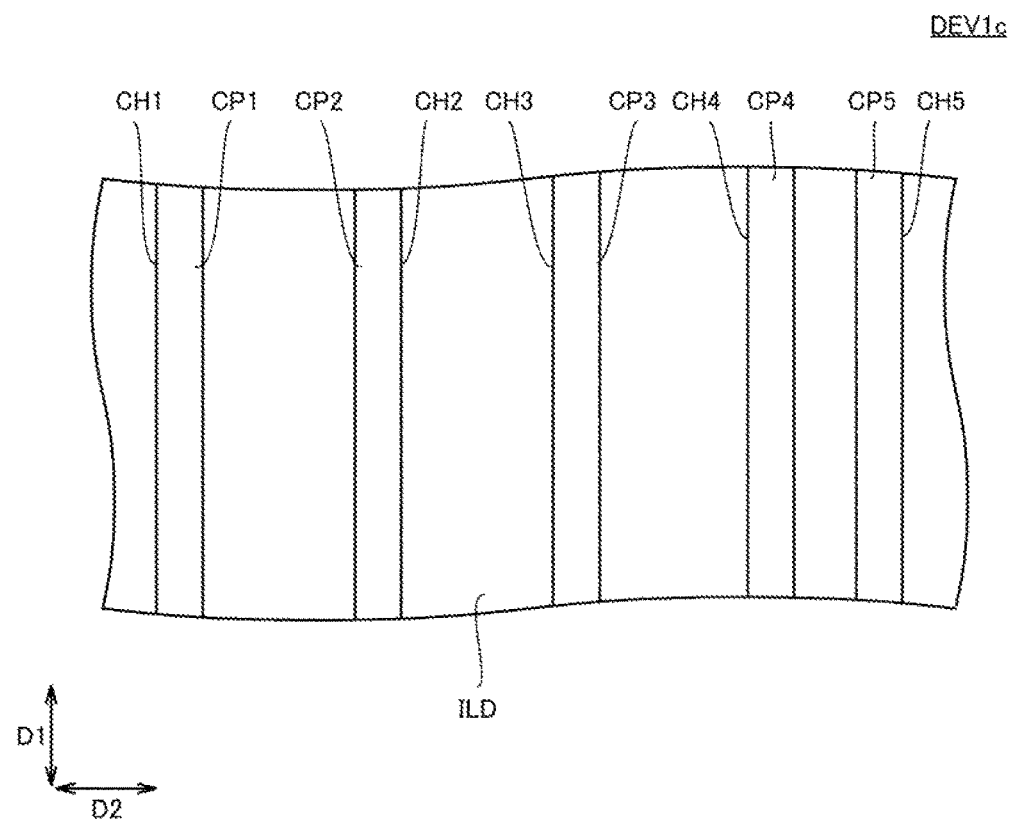
FIG. 26 is a plan view of the semiconductor device DEV1c.

FIG. 25 is a cross-sectional view of the semiconductor device DEV1c. FIG. 26 is a plan view of the semiconductor device DEV1c. In FIG. 26, illustration of wiring WL1, wiring WL2, wiring WL3, and wiring WL4, and a polyimide film PF is omitted. As illustrated in FIGS. 25 and 26, in the semiconductor device DEV1c, a contact hole CH1, a contact hole CH2, a contact hole CH3, a contact hole CH4, and a contact hole CH5 extend along a first direction D1 in plan view. However, in the semiconductor device DEV1c, the shapes of the contact hole CH1, the contact hole CH2, the contact hole CH3, the contact hole CH4, and the contact hole CH5 in plan view are not limited to the shapes.

<Manufacturing Method of Semiconductor Device DEV1c>

Hereinafter, a manufacturing method of the semiconductor device DEV1c will be described.

Figure 27A:
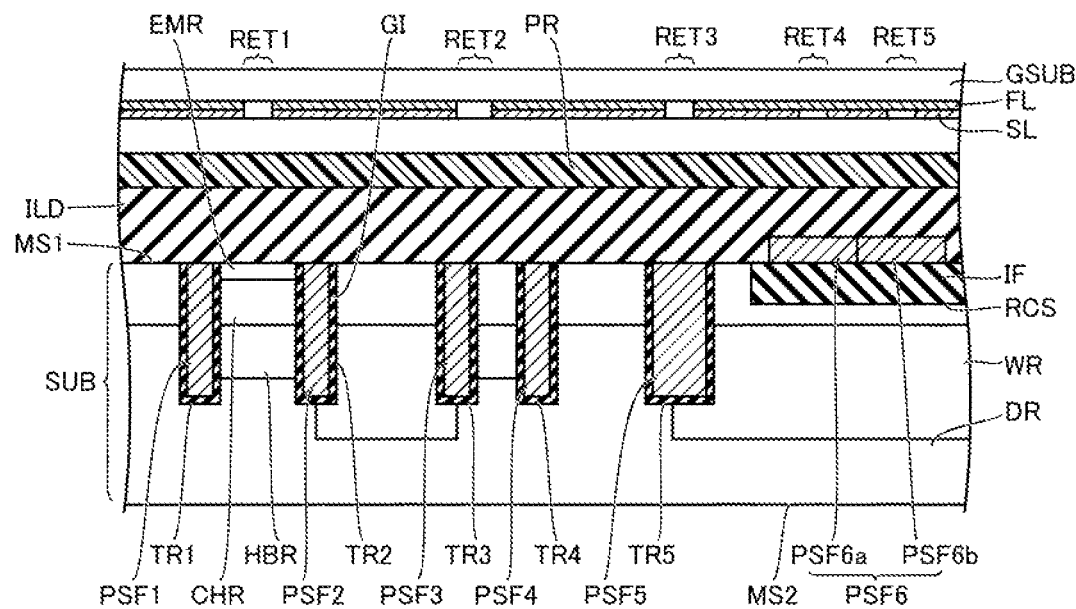
FIG. 27A is a first cross-sectional view for explaining a resist patterning step of a manufacturing method of the semiconductor device DEV1c.

FIG. 27A is a first cross-sectional view for explaining a resist patterning step of the manufacturing method of the semiconductor device DEV1c. As illustrated in FIG. 27A, a reticle RET used in the resist patterning step S112 of the manufacturing method of the semiconductor device DEV1c includes a light transmitting section RET1, a light transmitting section RET2, a light transmitting section RET3, a light transmitting section RET4, and a light transmitting section RET5. Portions of a resist PR at positions corresponding to a contact hole CH1, a contact hole CH2, a contact hole CH3, a contact hole CH4, and a contact hole CH5 are exposed by light transmitted through the light transmitting section RET1, the light transmitting section RET2, the light transmitting section RET3, the light transmitting section RET4, and the light transmitting section RET5, respectively.

The light transmittances in the light transmitting section RET1, the light transmitting section RET2, and the light transmitting section RET3 are larger than the light transmittances in the light transmitting section RET4 and the light transmitting section RET5. The light transmittances in the light transmitting section RET1, the light transmitting section RET2, and the light transmitting section RET3 are, for example, 100%. On the other hand, the light transmittances in the light transmitting section RET4 and the light transmitting section RET5 are, for example, equal to or higher than 50% and equal to or lower than 80%. That is, in the light transmitting section RET4 and the light transmitting section RET5, the reticle RET is of a halftone. A first layer FL and a second layer SL are removed in the light transmitting section RET1, the light transmitting section RET2, and the light transmitting section RET3. On the other hand, the second layer SL is removed, but the first layer FL remains in the light transmitting section RET4 and the light transmitting section RET5.

Figure 27B:
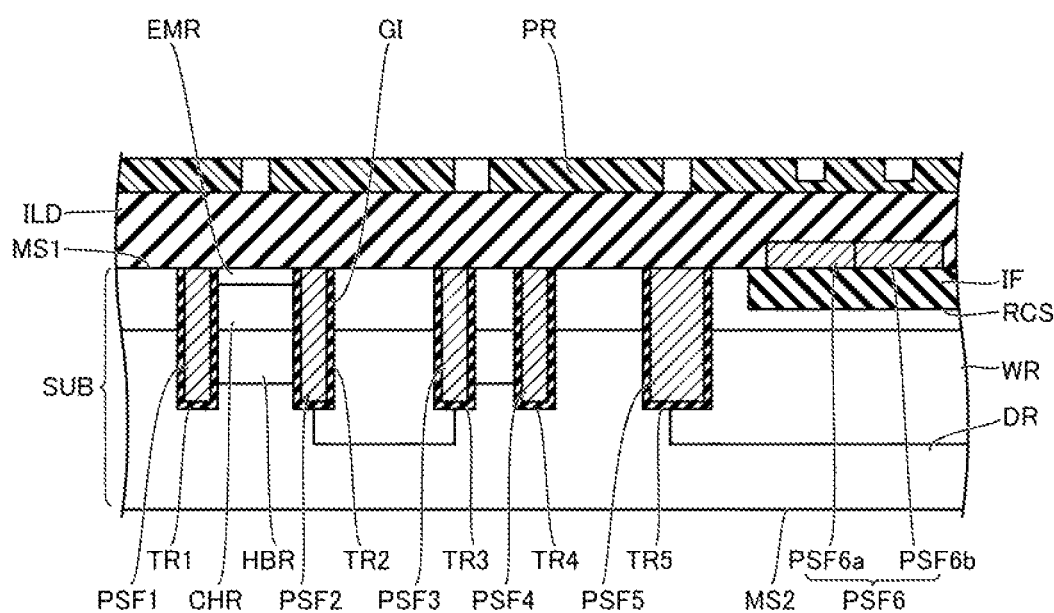
FIG. 27B is a second cross-sectional view for explaining the resist patterning step of the manufacturing method of the semiconductor device DEV1c.

FIG. 27B is a second cross-sectional view for explaining the resist patterning step of the manufacturing method of the semiconductor device DEV1c. In the resist patterning step S112 of the manufacturing method of the semiconductor device DEV1c, the light transmittances in the light transmitting section RET1, the light transmitting section RET2, and the light transmitting section RET3 are larger than the light transmittances in the light transmitting section RET4 and the light transmitting section RET5. Therefore, by development after the exposure, openings for exposing an interlayer insulating film ILD are formed at portions of the resist PR at positions corresponding to the contact hole CH1, the contact hole CH2, and the contact hole CH3, but the resist PR remains at the bottom surfaces of openings of the resist PR at positions corresponding to the contact hole CH4 and the contact hole CH5.

In the manufacturing method of the semiconductor device DEV1c, the etching conditions in a first etching step S113 are set such that the etching rate for the interlayer insulating film ILD is higher than the etching rate for the resist PR. As a result, the etching on the interlayer insulating film ILD at positions where the contact hole CH4 and the contact hole CH5 are to be formed is slower than the etching on the interlayer insulating film ILD at positions where the contact hole CH1, the contact hole CH2, and the contact hole CH3 are to be formed. Therefore, even in the manufacturing method of the semiconductor device DEV1c, the contact hole CH4 and the contact hole CH5 do not penetrate the interlayer insulating film ILD at the time when the contact hole CH1, the contact hole CH2, and the contact hole CH3 penetrate the interlayer insulating film ILD.

More specifically, in the manufacturing method of the semiconductor device DEV1c, the etching gas used in the first etching step S113 is a fluorocarbon-based gas, and its C/F ratio is, for example, equal to or higher than 0.5. This etching gas is used together with oxygen and argon. The etching gas is, for example, octafluorocyclobutane ($C_4F_8$).

<Effects of Manufacturing Method of Semiconductor Device DEV1c>

Hereinafter, effects of the manufacturing method of the semiconductor device DEV1c will be described.

In the manufacturing method of the semiconductor device DEV1c, the resist for forming the contact hole CH1, the contact hole CH2, the contact hole CH3, the contact hole CH4, and the contact hole CH5 is formed only once as similar to the manufacturing method of the semiconductor device DEV1, and therefore, it is possible to reduce the manufacturing cost for forming the contact hole CH1, the contact hole CH2, the contact hole CH3, the contact hole CH4, and the contact hole CH5.

Second Embodiment

A semiconductor device according to a second embodiment will be described. The semiconductor device according to the second embodiment is a semiconductor device DEV2. Here, the differences from the semiconductor device DEV1 will be described, and repetitive description will not be repeated.

<Configuration of Semiconductor Device DEV2>

Hereinafter, the configuration of the semiconductor device DEV2 will be described.

Figure 28:
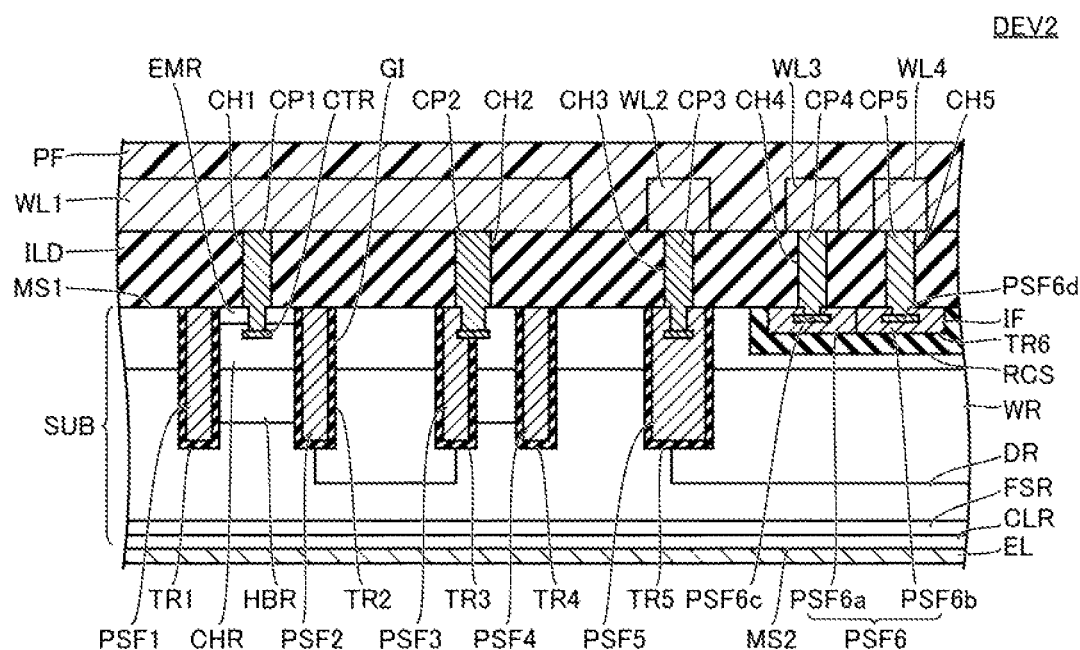
FIG. 28 is a cross-sectional view of a semiconductor device DEV2.

FIG. 28 is a cross-sectional view of the semiconductor device DEV2. As illustrated in FIG. 28, the semiconductor device DEV2 includes a semiconductor substrate SUB, a gate insulating film GI, a polysilicon film PSF1, a polysilicon film PSF2, a polysilicon film PSF3, a polysilicon film PSF4, and a polysilicon film PSF5, an insulating film IF, a polysilicon film PSF6, and an interlayer insulating film ILD. The semiconductor device DEV2 further includes a contact plug CP1, a contact plug CP2, a contact plug CP3, a contact plug CP4, and a contact plug CP5, wiring WL1, wiring WL2, wiring WL3, and wiring WL4, a polyimide film PF, and an electrode EL. In this respect, the configuration of the semiconductor device DEV2 is common with the configuration of the semiconductor device DEV1.

In the semiconductor device DEV2, a trench TR6 is formed in the upper surface of the insulating film IF. The trench TR6 extends toward the bottom surface of the insulating film IF. The polysilicon film PSF6 is embedded in the trench TR6. In the semiconductor device DEV2, the lower ends of a contact hole CH4 and a contact hole CH5 reach the polysilicon film PSF6. In these respects, the configuration of the semiconductor device DEV2 is different from the configuration of the semiconductor device DEV1. In the semiconductor device DEV2, note that a contact hole CH1, a contact hole CH2, a contact hole CH3, the contact hole CH4, and the contact hole CH5 may extend along a first direction D1 in plan view although not illustrated.

<Manufacturing Method of Semiconductor Device DEV2>

Hereinafter, a manufacturing method of the semiconductor device DEV2 will be described.

Figure 29:
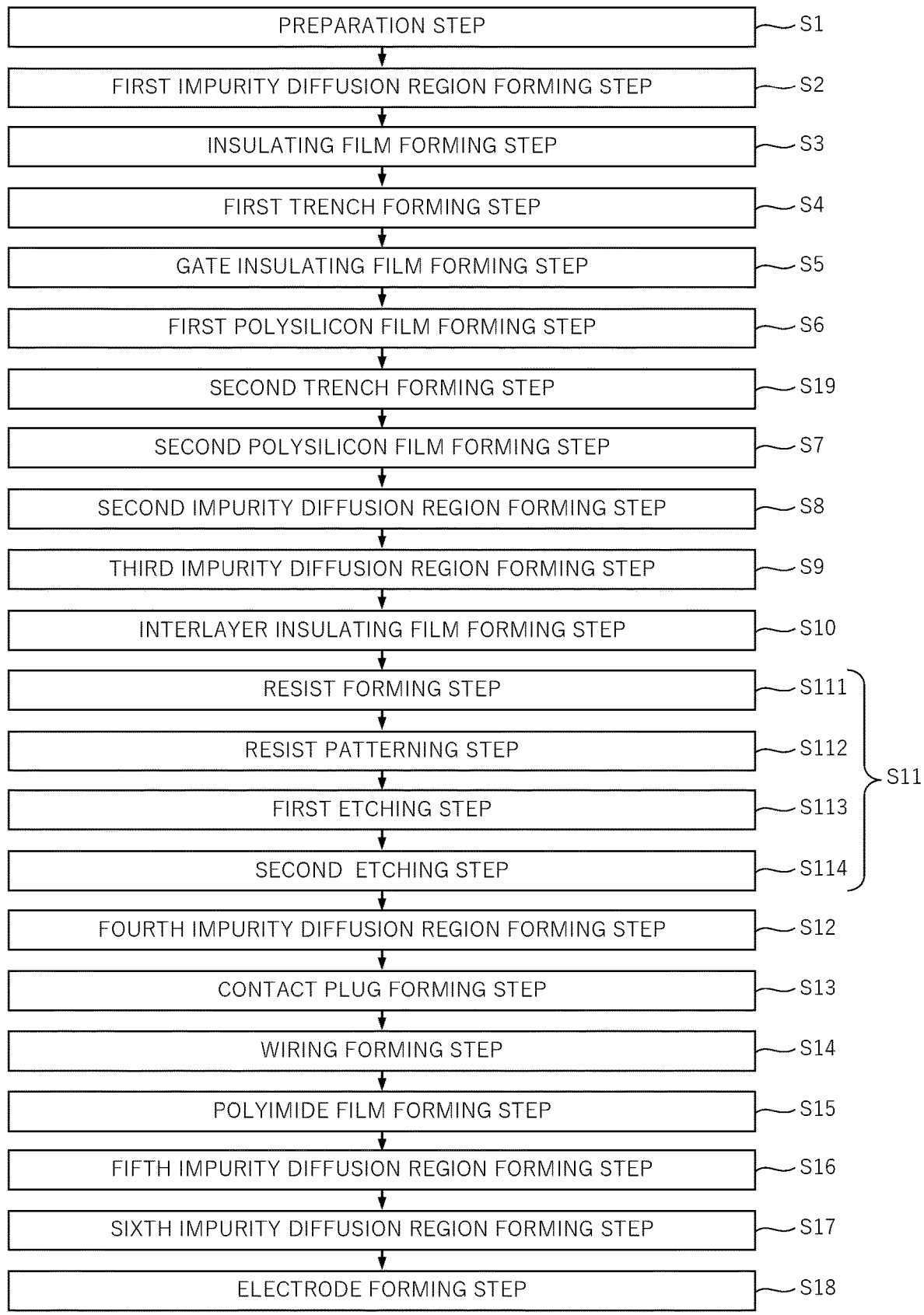
FIG. 29 is a process diagram illustrating a manufacturing method of the semiconductor device DEV2.

FIG. 29 is a process diagram illustrating the manufacturing method of the semiconductor device DEV2. As illustrated in FIG. 29, the manufacturing method of the semiconductor device DEV2 includes a preparation step S1, a first impurity diffusion region forming step S2, an insulating film forming step S3, a first trench forming step S4, a gate insulating film forming step S5, a first polysilicon film forming step S6, a second polysilicon film forming step S7, a second impurity diffusion region forming step S8, a third impurity diffusion region forming step S9, an interlayer insulating film forming step S10, a contact hole forming step S11, a fourth impurity diffusion region forming step S12, and a contact plug forming step S13. The manufacturing method of the semiconductor device DEV2 further includes a wiring forming step S14, a polyimide film forming step S15, a fifth impurity diffusion region forming step S16, a sixth impurity diffusion region forming step S17, and an electrode forming step S18. In this respect, the manufacturing method of the semiconductor device DEV2 is common with the manufacturing method of the semiconductor device DEV1.

The manufacturing method of the semiconductor device DEV2 is different from the manufacturing method of the semiconductor device DEV1 in further including a second trench forming step S19. The manufacturing method of the semiconductor device DEV2 is also different from the manufacturing method of the semiconductor device DEV1 in details of the second polysilicon film forming step S7, the second impurity diffusion region forming step S8, the third impurity diffusion region forming step S9, the interlayer insulating film forming step S10, and the contact hole forming step S11. Note that the second trench forming step S19 is performed after the first polysilicon film forming step S6 and before the second polysilicon film forming step S7.

Figure 30:
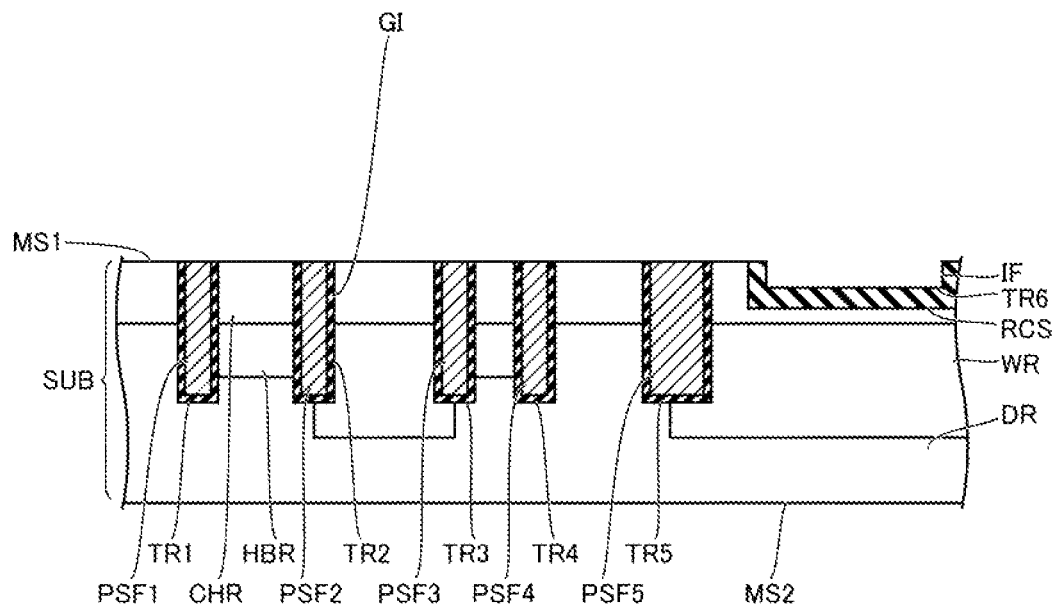
FIG. 30 is a cross-sectional view for explaining a second trench forming step S19 of the manufacturing method of the semiconductor device DEV2.

FIG. 30 is a cross-sectional view for explaining the second trench forming step S19 of the manufacturing method of the semiconductor device DEV2. As illustrated in FIG. 30, a trench TR6 is formed by the second trench forming step S19 of the manufacturing method of the semiconductor device DEV2. The trench TR6 is formed by etching using a resist formed on a first main surface MS1 as a mask. Note that the resist is removed after the etching.

Figure 31:
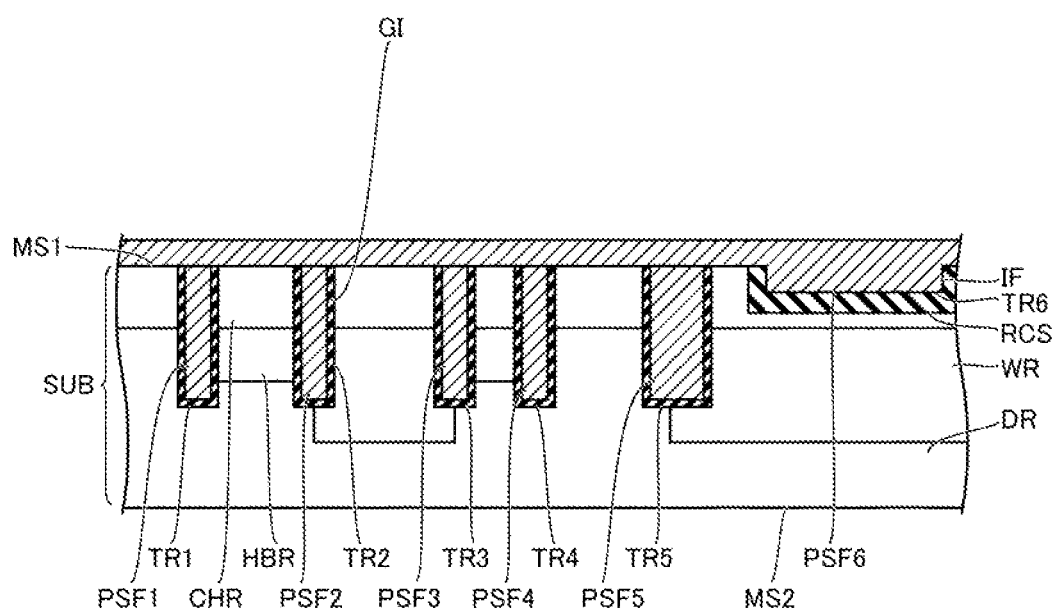
FIG. 31 is a cross-sectional view for explaining a second polysilicon film forming step S7 of the manufacturing method of the semiconductor device DEV2.

FIG. 31 is a cross-sectional view for explaining the second polysilicon film forming step S7 of the manufacturing method of the semiconductor device DEV2. As illustrated in FIG. 31, in the second polysilicon film forming step S7, a polysilicon film PSF6 is formed. Second, the polysilicon film PSF6 is formed on the first main surface MS1 so as to be embedded in the trench TR6. At this stage, the polysilicon film PSF6 does not contain a dopant.

Figure 32:
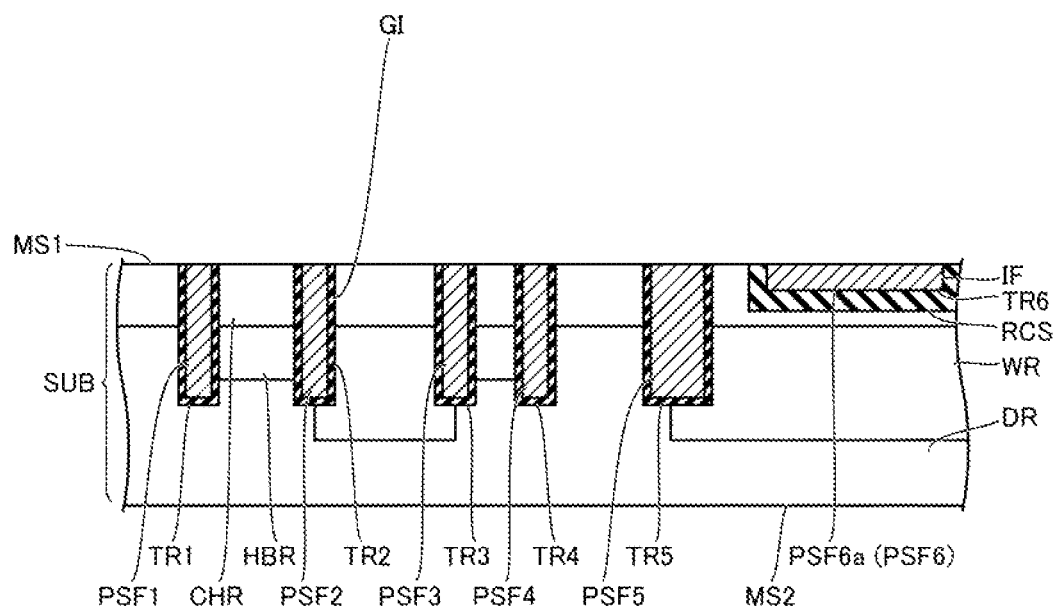
FIG. 32 is a cross-sectional view for explaining a second impurity diffusion region forming step S8 of the manufacturing method of the semiconductor device DEV2.

FIG. 32 is a cross-sectional view for explaining the second impurity diffusion region forming step S8 of the manufacturing method of the semiconductor device DEV2. As illustrated in FIG. 32, in the second impurity diffusion region forming step S8 of the manufacturing method of the semiconductor device DEV2, first, a channel region CHR is formed by ion implantation. In this ion implantation, a dopant is also implanted into the polysilicon film PSF6. Second, the polysilicon film PSF6 protruding from the trench TR6 is removed by, for example, CMP.

Figure 33:
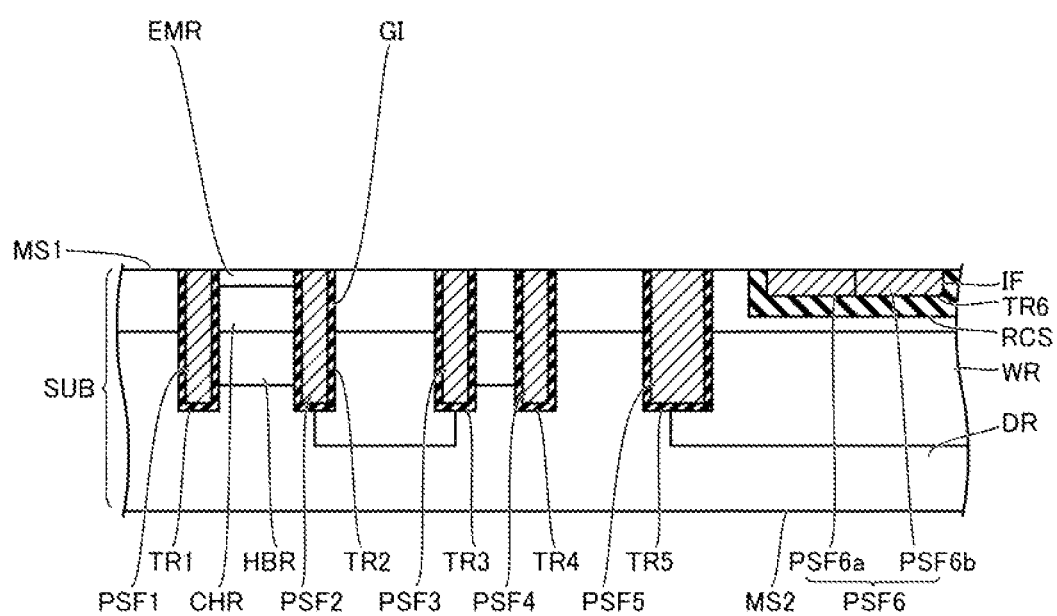
FIG. 33 is a cross-sectional view for explaining a third impurity diffusion region forming step S9 of the manufacturing method of the semiconductor device DEV2.

FIG. 33 is a cross-sectional view for explaining the third impurity diffusion region forming step S9 of the manufacturing method of the semiconductor device DEV2. As illustrated in FIG. 33, in the third impurity diffusion region forming step S9 of the manufacturing method of the semiconductor device DEV2, an emitter region EMR is formed by ion implantation. In this ion implantation, a dopant is also implanted into a portion of the polysilicon film PSF6 to be a second portion PSF6b. A portion of the polysilicon film PSF6 into which the dopant is not implanted in this time becomes a first portion PSF6a. In this ion implantation, a resist is disposed on the first main surface MS1 of a portion of the semiconductor substrate SUB where the emitter region EMR is not to be formed, and on a portion of the polysilicon film PSF6 where the second portion PSF6b is not to be formed. This resist is removed after the above-described ion implantation is performed.

Figure 34:
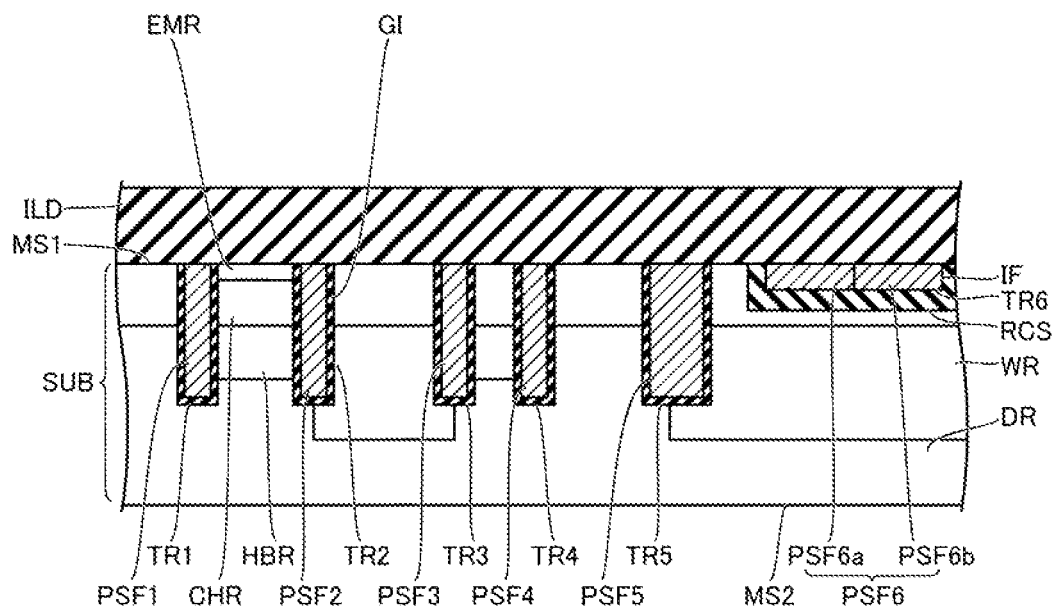
FIG. 34 is a cross-sectional view for explaining an interlayer insulating film forming step S10 of the manufacturing method of the semiconductor device DEV2.

FIG. 34 is a cross-sectional view for explaining the interlayer insulating film forming step S10 of the manufacturing method of the semiconductor device DEV2. As illustrated in FIG. 34, in the interlayer insulating film forming step S10 of the manufacturing method of the semiconductor device DEV2, an interlayer insulating film ILD is formed. In the interlayer insulating film forming step S10, first, a film made of a constituent material (silicon oxide) of the interlayer insulating film ILD is formed on the first main surface MS1 so as to cover the polysilicon film PSF6 and an insulating film IF. However, after the interlayer insulating film ILD is formed, the upper surface of the interlayer insulating film ILD may not be planarized by CMP or the like.

Figure 35A:
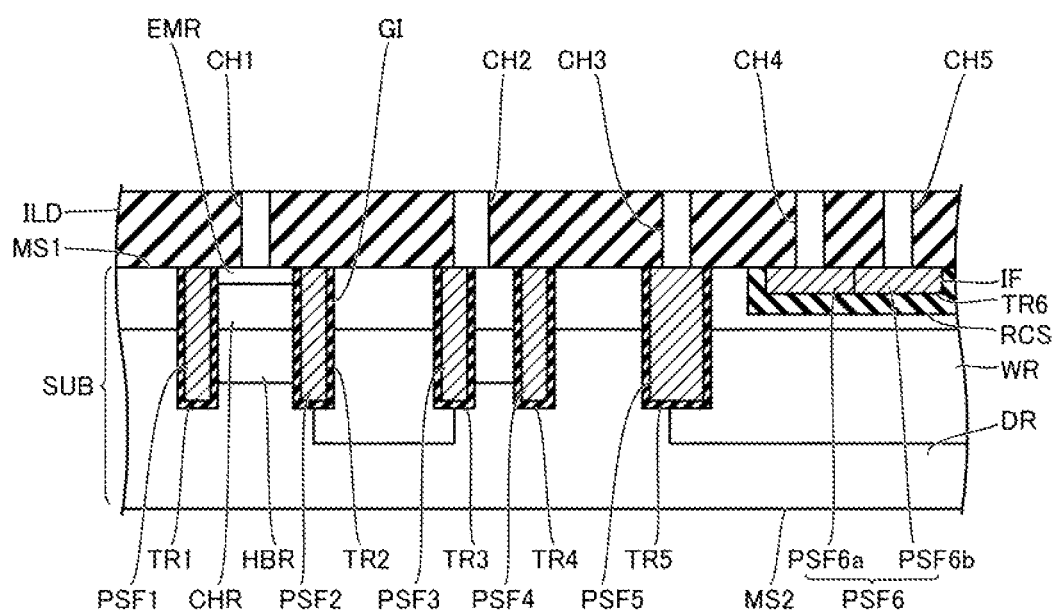
FIG. 35A is a cross-sectional view for explaining a first etching step S113 of the manufacturing method of the semiconductor device DEV2.

FIG. 35A is a cross-sectional view for explaining a first etching step S113 of the manufacturing method of the semiconductor device DEV2. As illustrated in FIG. 35A, in the first etching step S113 of the manufacturing method of the semiconductor device DEV2, a contact hole CH1, a contact hole CH2, a contact hole CH3, a contact hole CH4, and a contact hole CH5 are formed in the interlayer insulating film ILD.

By the first etching step S113 of the manufacturing method of the semiconductor device DEV2, not only the contact hole CH1, the contact hole CH2, and the contact hole CH3 but also the contact hole CH4 and the contact hole CH5 penetrate the interlayer insulating film ILD after the first etching step S113 is performed. Therefore, in the manufacturing method of the semiconductor device DEV2, the third etching step S115 is unnecessary.

Figure 35B:
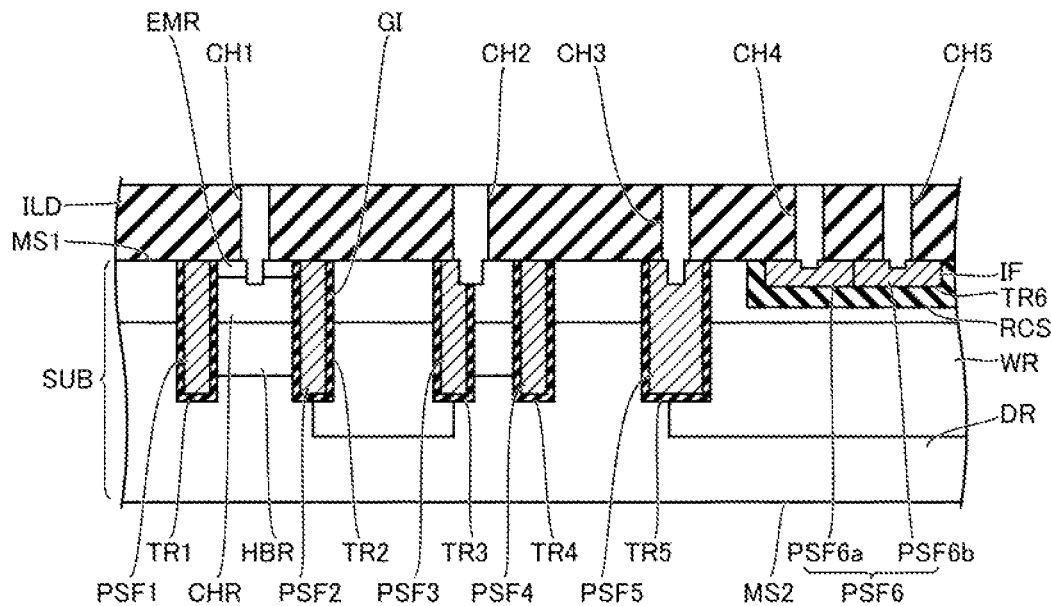
FIG. 35B is a cross-sectional view for explaining a second etching step S114 of the manufacturing method of the semiconductor device DEV2.

FIG. 35B is a cross-sectional view for explaining a second etching step S114 of the manufacturing method of the semiconductor device DEV2. As illustrated in FIG. 35B, in the second etching step S114 of the manufacturing method of the semiconductor device DEV2, the contact hole CH1 extends so as to reach the channel region CHR between a trench TR1 and a trench TR2. In the second etching step S114 of the manufacturing method of the semiconductor device DEV2, the contact hole CH2 extends so as to reach the channel region CHR between a trench TR3 and a trench TR4 and reach a polysilicon film PSF3, and the contact hole CH3 extends so as to reach a polysilicon film PSF5.

Further, in the second etching step S114 of the manufacturing method of the semiconductor device DEV2, the contact hole CH4 and the contact hole CH5 extend so as to reach the polysilicon film PSF6.

<Effects of Manufacturing Method of Semiconductor Device DEV2>

Hereinafter, effects of the manufacturing method of the semiconductor device DEV2 will be described.

As described above, also in the manufacturing method of the semiconductor device DEV2, a resist for forming the contact hole CH1, the contact hole CH2, the contact hole CH3, the contact hole CH4, and the contact hole CH5 is formed only once. Therefore, according to the manufacturing method of the semiconductor device DEV2, it is possible to reduce the manufacturing cost for forming the contact hole CH1, the contact hole CH2, the contact hole CH3, the contact hole CH4, and the contact hole CH5.

Furthermore, in the manufacturing method of the semiconductor device DEV2, the thickness of a portion of the interlayer insulating film ILD where the contact hole CH1, the contact hole CH2, and the contact hole CH3 are formed is not different from the thickness of a portion of the interlayer insulating film ILD where the contact hole CH4 and the contact hole CH5 are formed, and therefore, the polysilicon film PSF6 is prevented from being penetrated by the contact hole CH4 and the contact hole CH5 during the contact hole forming step S11.

First Modification Example

The semiconductor device DEV2 according to a first modification example is a semiconductor device DEV2a. Here, the differences from the semiconductor device DEV2 will be mainly described, and repetitive description will not be repeated.

<Configuration of Semiconductor Device DEV2a>

Hereinafter, the configuration of the semiconductor device DEV2a will be described.

Figure 36:
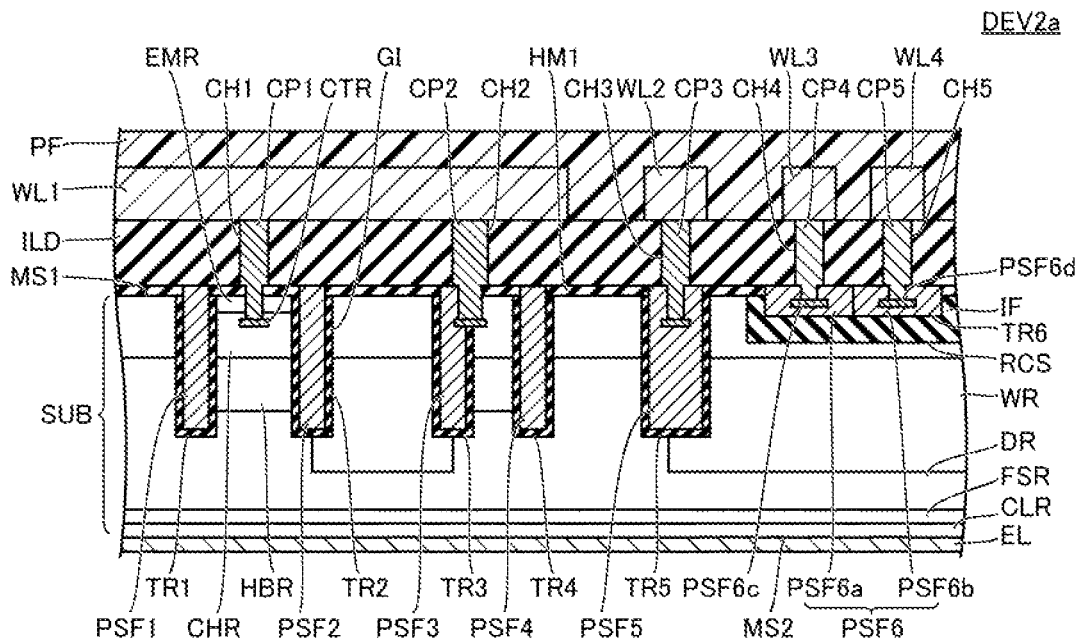

FIG. 36 is a cross-sectional view of the semiconductor device DEV2a. As illustrated in FIG. 36, the semiconductor device DEV2a further includes a hard mask HM1. The hard mask HM1 is disposed on a first main surface MS1 and on an insulating film IF. An interlayer insulating film ILD is disposed on the hard mask HM1. A trench TR1, a trench TR2, a trench TR3, a trench TR4, a trench TR5, and a trench TR6 extend so as to penetrate the hard mask HM1. The hard mask HM1 is made of, for example, silicon oxide.

<Manufacturing Method of Semiconductor Device DEV2a>

Hereinafter, a manufacturing method of the semiconductor device DEV2a will be described.

Figure 37:
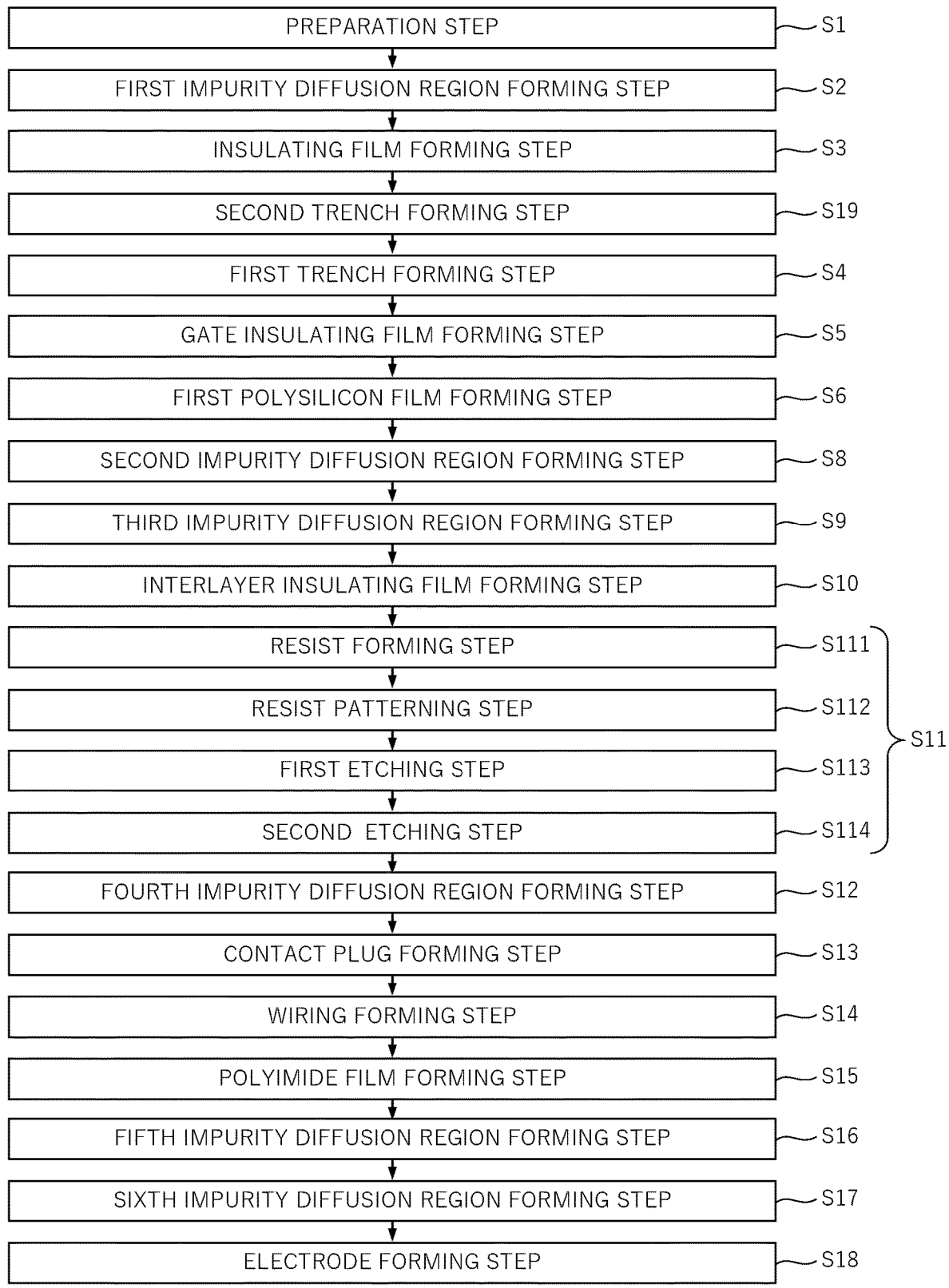

FIG. 37 is a process diagram illustrating the manufacturing method of the semiconductor device DEV2a. As illustrated in FIG. 37, in the manufacturing method of the semiconductor device DEV2a, a second trench forming step S19 is performed after an insulating film forming step S3 and before a first trench forming step S4. The manufacturing method of the semiconductor device DEV2a does not include the second polysilicon film forming step S7.

Figure 38:
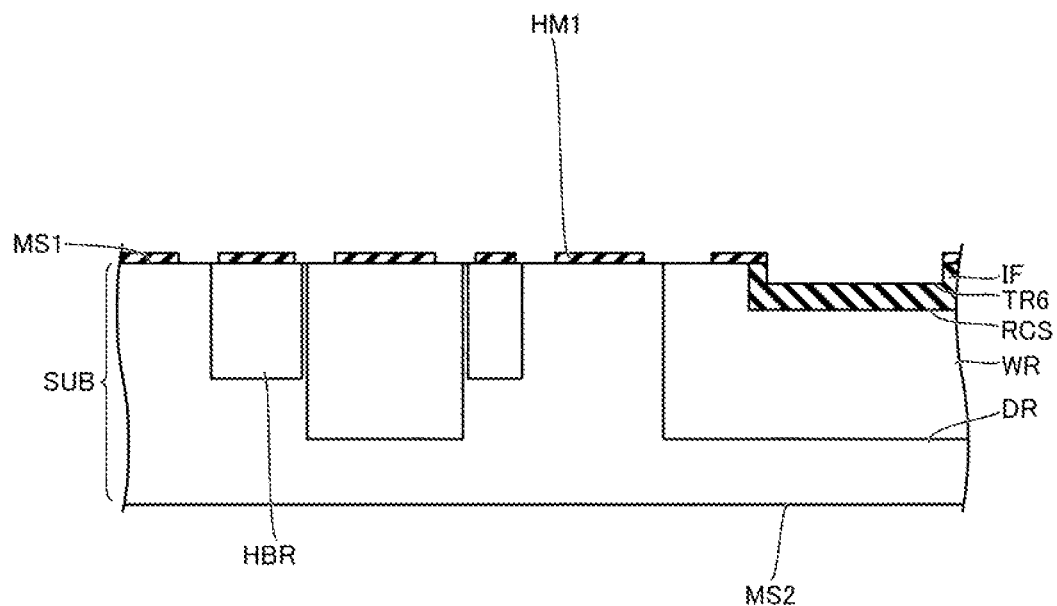

FIG. 38 is a cross-sectional view for explaining the second trench forming step S19 of the manufacturing method of the semiconductor device DEV2a. As illustrated in FIG. 38, a hard mask HM1 and a trench TR6 are formed in the second trench forming step S19 of the manufacturing method of the semiconductor device DEV2a. In the second trench forming step S19 of the manufacturing method of the semiconductor device DEV2a, first, the hard mask HM1 is formed on a first main surface MS1.

Second, the hard mask HM1 is etched using a resist patterned by photolithography as a mask. In the hard mask HM1 after the etching, openings are formed at positions corresponding to a trench TR1, a trench TR2, a trench TR3, a trench TR4, and a trench TR5. Furthermore, by this etching, the trench TR6 that penetrates the hard mask HM1 is formed in an insulating film IF.

Figure 39:
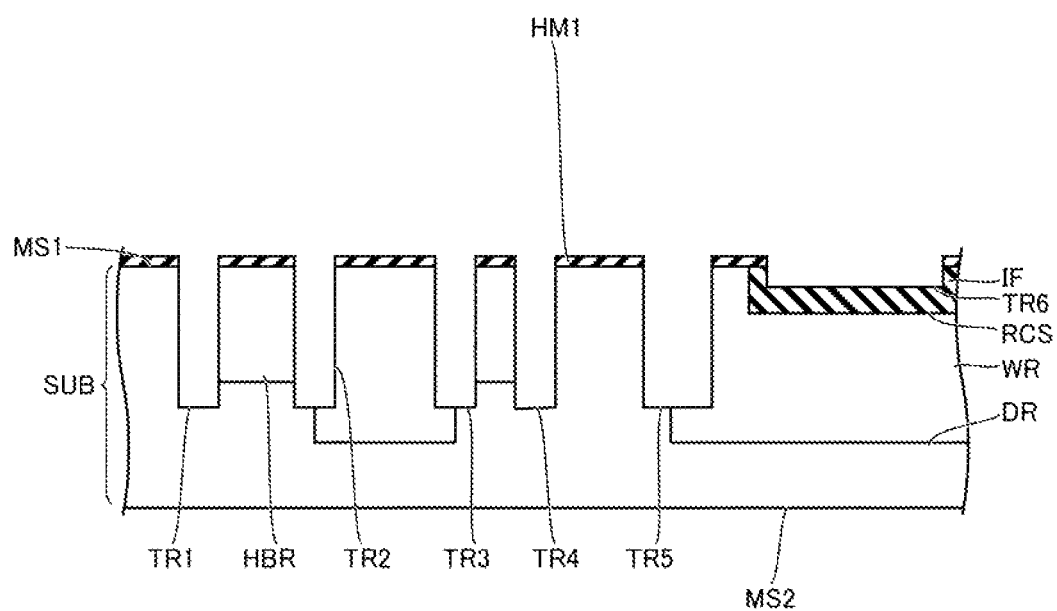

FIG. 39 is a cross-sectional view for explaining the first trench forming step S4 of the manufacturing method of the semiconductor device DEV2a. As illustrated in FIG. 39, in the first trench forming step S4 of the manufacturing method of the semiconductor device DEV2a, the trench TR1, the trench TR2, the trench TR3, the trench TR4, and the trench TR5 are formed. The trench TR1, the trench TR2, the trench TR3, the trench TR4, and the trench TR5 are formed by etching using the hard mask HM1 as a mask.

Figure 40:
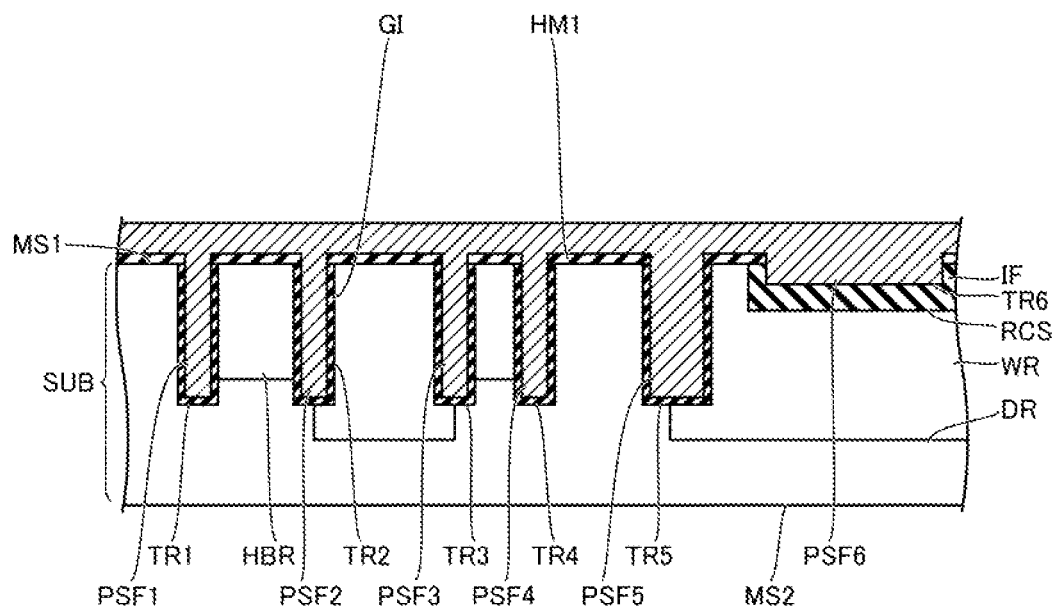

FIG. 40 is a cross-sectional view for explaining a first polysilicon film forming step S6 of the manufacturing method of the semiconductor device DEV2a. As illustrated in FIG. 40, in the first polysilicon film forming step S6 of the manufacturing method of the semiconductor device DEV2a, a polysilicon film PSF6 is formed in addition to a polysilicon film PSF1, a polysilicon film PSF2, a polysilicon film PSF3, a polysilicon film PSF4, and a polysilicon film PSF5. In the first polysilicon film forming step S6 of the manufacturing method of the semiconductor device DEV2a, first, polysilicon is embedded in the trench TR1, the trench TR2, the trench TR3, the trench TR4, the trench TR5, and the trench TR6. The polysilicon is embedded by, for example, CVD. The polysilicon contains a p-type dopant.

Second, ion implantation is performed. Consequently, an n-type dopant is implanted into the polysilicon in the upper portions of the polysilicon film PSF1, the polysilicon film PSF2, the polysilicon film PSF3, the polysilicon film PSF4, and the polysilicon film PSF5. The n-type dopant diffuses in the polysilicon film PSF1, the polysilicon film PSF2, the polysilicon film PSF3, the polysilicon film PSF4, and the polysilicon film PSF5 by heat treatment after the ion implantation, and the conductivity types of the polysilicon film PSF1, the polysilicon film PSF2, the polysilicon film PSF3, the polysilicon film PSF4, and the polysilicon film PSF5 become n-type. Third, the polysilicon protruding from the trench TR1, the trench TR2, the trench TR3, the trench TR4, the trench TR5, and the trench TR6 is removed by, for example, CMP.

<Effects of Manufacturing Method of Semiconductor Device DEV2a>

Hereinafter, effects of the manufacturing method of the semiconductor device DEV2a will be described.

In the manufacturing method of the semiconductor device DEV2a, a resist for forming a contact hole CH1, a contact hole CH2, a contact hole CH3, a contact hole CH4, and a contact hole CH5 is formed only once as similar to the manufacturing method of the semiconductor device DEV2, and therefore, it is possible to reduce the manufacturing cost for forming the contact hole CH1, the contact hole CH2, the contact hole CH3, the contact hole CH4, and the contact hole CH5.

In the manufacturing method of the semiconductor device DEV2a, the hard mask HM1 is formed on the insulating film IF, and therefore, the depth of the trench TR6 can be secured even if the thickness of the insulating film IF is reduced. In the manufacturing method of the semiconductor device DEV2a, the resist for forming the trench TR1, the trench TR2, the trench TR3, the trench TR4, the trench TR5, and the trench TR6 is formed only once, and therefore, it is possible to reduce the manufacturing cost for forming the trench TR1, the trench TR2, the trench TR3, the trench TR4, the trench TR5, and the trench TR6.

Furthermore, in the manufacturing method of the semiconductor device DEV2a, the polysilicon film PSF1, the polysilicon film PSF2, the polysilicon film PSF3, the polysilicon film PSF4, the polysilicon film PSF5, and the polysilicon film PSF6 can be embedded in one process, and therefore, the process can be simplified.

Second Modification Example

The semiconductor device DEV2 according to a second modification example is a semiconductor device DEV2b. Here, the differences from the semiconductor device DEV2 will be mainly described, and repetitive description will not be repeated.

<Configuration of Semiconductor Device DEV2b>

Hereinafter, the configuration of the semiconductor device DEV2b will be described.

Figure 41:
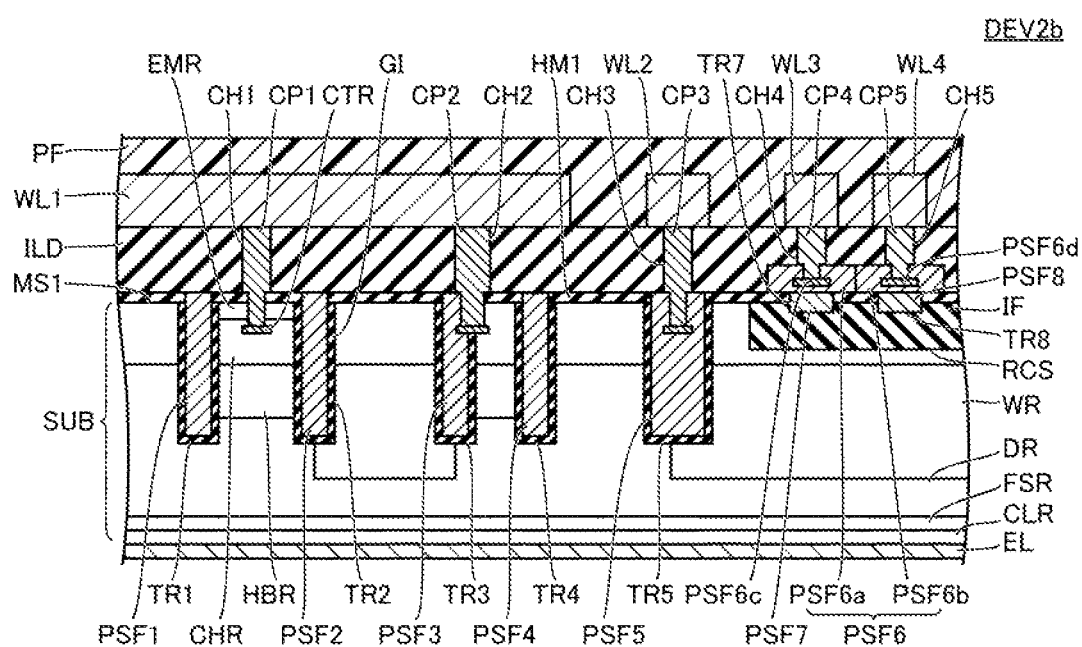
FIG. 41 is a cross-sectional view of a semiconductor device DEV2b.

FIG. 41 is a cross-sectional view of the semiconductor device DEV2b. As illustrated in FIG. 41, the semiconductor device DEV2b further includes a hard mask HM1, a polysilicon film PSF7, and a polysilicon film PSF8.

The hard mask HM1 is disposed on a first main surface MS1 and on an insulating film IF. An interlayer insulating film ILD is disposed on the hard mask HM1. In the semiconductor device DEV2b, a trench TR7 and a trench TR8 are formed instead of the trench TR6. The trench TR7 and the trench TR8 are formed in the upper surface of the insulating film IF, and extend toward the bottom surface of the insulating film IF. The trench TR7 and the trench TR8 are at positions overlapping a contact hole CH4 and a contact hole CH5 in plan view, respectively.

The polysilicon film PSF7 and the polysilicon film PSF8 are embedded in the trench TR7 and the trench TR8, respectively. A trench TR1, a trench TR2, a trench TR3, a trench TR4, a trench TR5, the trench TR7, and the trench TR8 extend so as to penetrate the hard mask HM1. A polysilicon film PSF6 is disposed on the hard mask HM1 (the polysilicon film PSF7 and the polysilicon film PSF8).

<Manufacturing Method of Semiconductor Device DEV2b>

Hereinafter, a manufacturing method of the semiconductor device DEV2b will be described.

Figure 42:
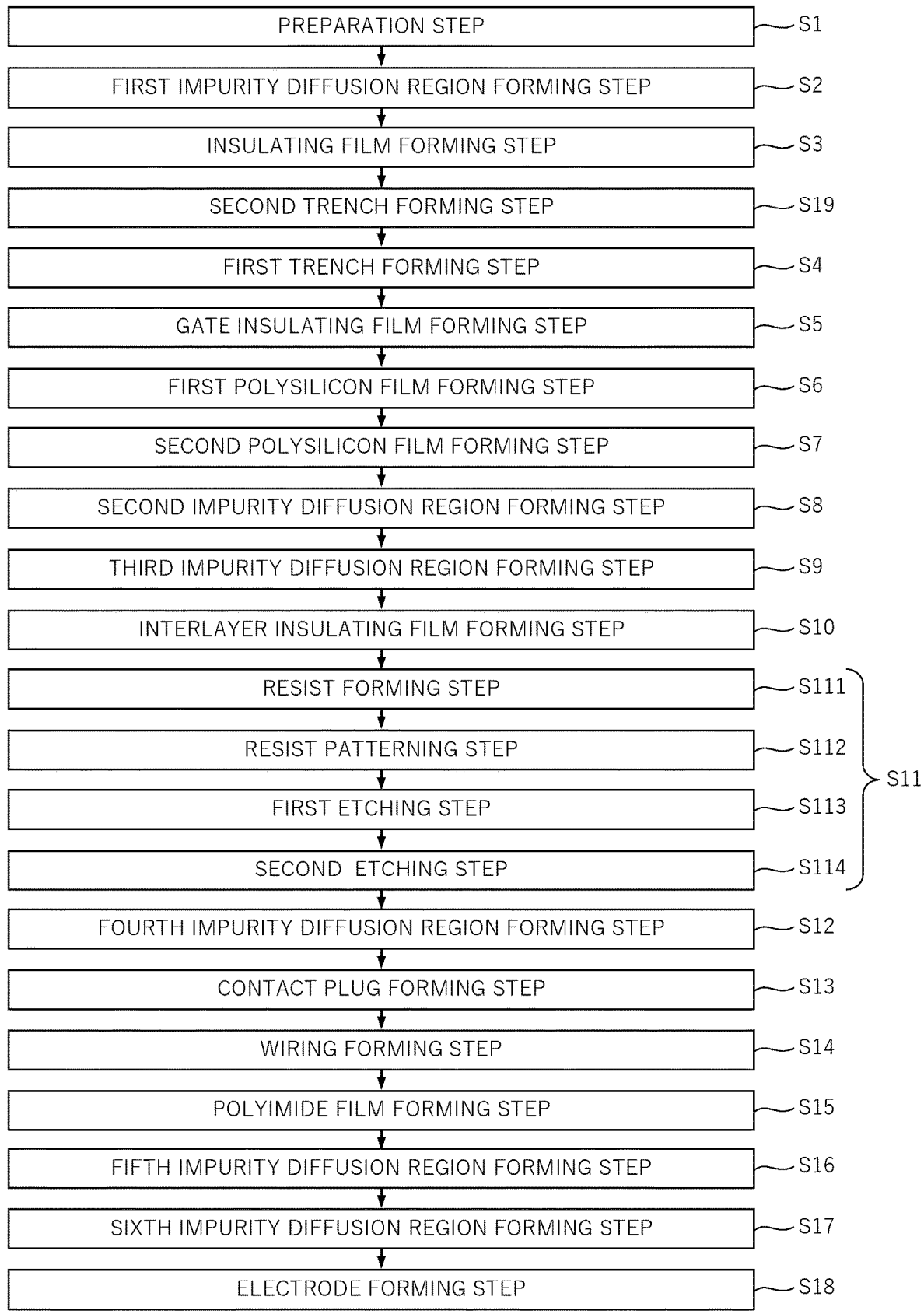
FIG. 42 is a process diagram illustrating a manufacturing method of the semiconductor device DEV2b.

FIG. 42 is a process diagram illustrating the manufacturing method of the semiconductor device DEV2b. As illustrated in FIG. 42, in the manufacturing method of the semiconductor device DEV2b, a second trench forming step S19 is performed after an insulating film forming step S3 and before a first trench forming step S4.

Figure 43:
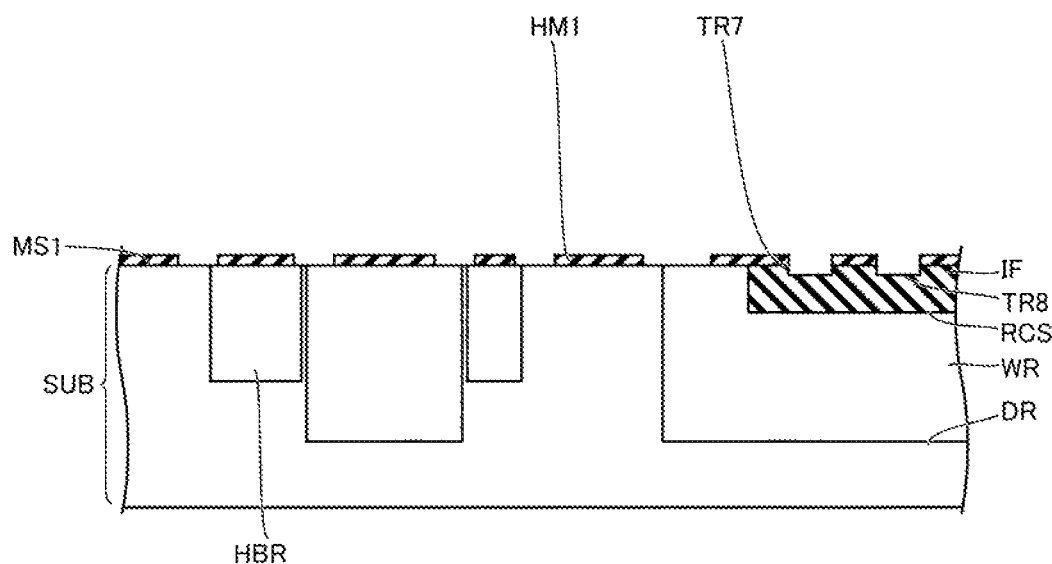
FIG. 43 is a cross-sectional view for explaining a second trench forming step S19 of the manufacturing method of the semiconductor device DEV2b.

FIG. 43 is a cross-sectional view for explaining the second trench forming step S19 of the manufacturing method of the semiconductor device DEV2b. As illustrated in FIG. 43, a hard mask HM1, a trench TR7, and a trench TR8 are formed in the second trench forming step S19 of the manufacturing method of the semiconductor device DEV2b. In the second trench forming step S19 of the manufacturing method of the semiconductor device DEV2b, first, the hard mask HM1 is formed on a first main surface MS1.

Second, the hard mask HM1 is etched using a resist patterned by photolithography as a mask. In the hard mask HM1 after the etching, openings are formed at positions corresponding to a trench TR1, a trench TR2, a trench TR3, a trench TR4, and a trench TR5. Furthermore, by this etching, the trenches TR7 and TR8 that penetrate the hard mask HM1 are formed in an insulating film IF.

Figure 44:
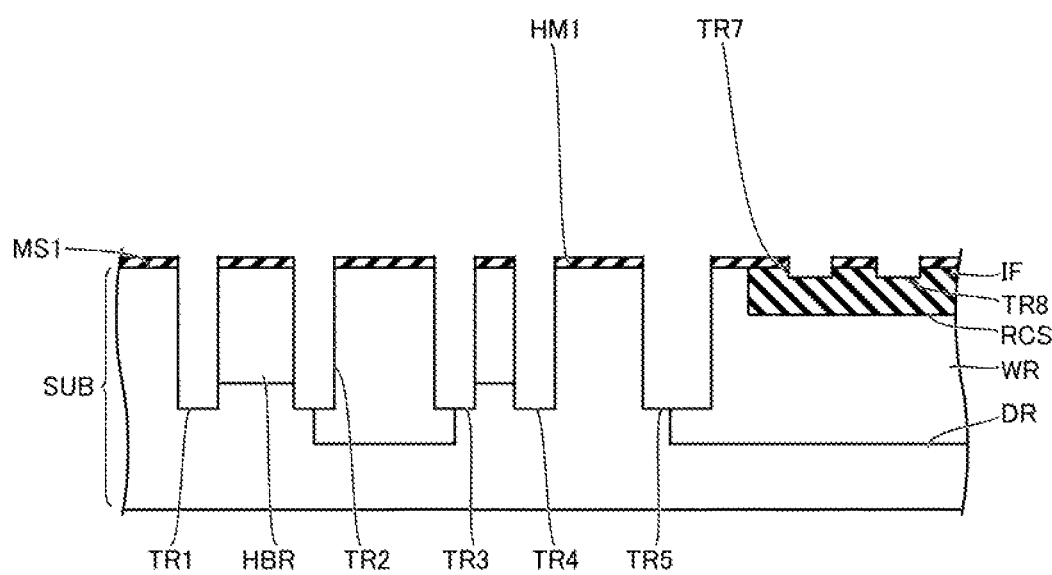
FIG. 44 is a cross-sectional view for explaining a first trench forming step S4 of the manufacturing method of the semiconductor device DEV2b.

FIG. 44 is a cross-sectional view for explaining the first trench forming step S4 of the manufacturing method of the semiconductor device DEV2b. As illustrated in FIG. 44, in the first trench forming step S4 of the manufacturing method of the semiconductor device DEV2b, the trench TR1, the trench TR2, the trench TR3, the trench TR4, and the trench TR5 are formed. The trench TR1, the trench TR2, the trench TR3, the trench TR4, and the trench TR5 are formed by etching using the hard mask HM1 as a mask.

Figure 45:
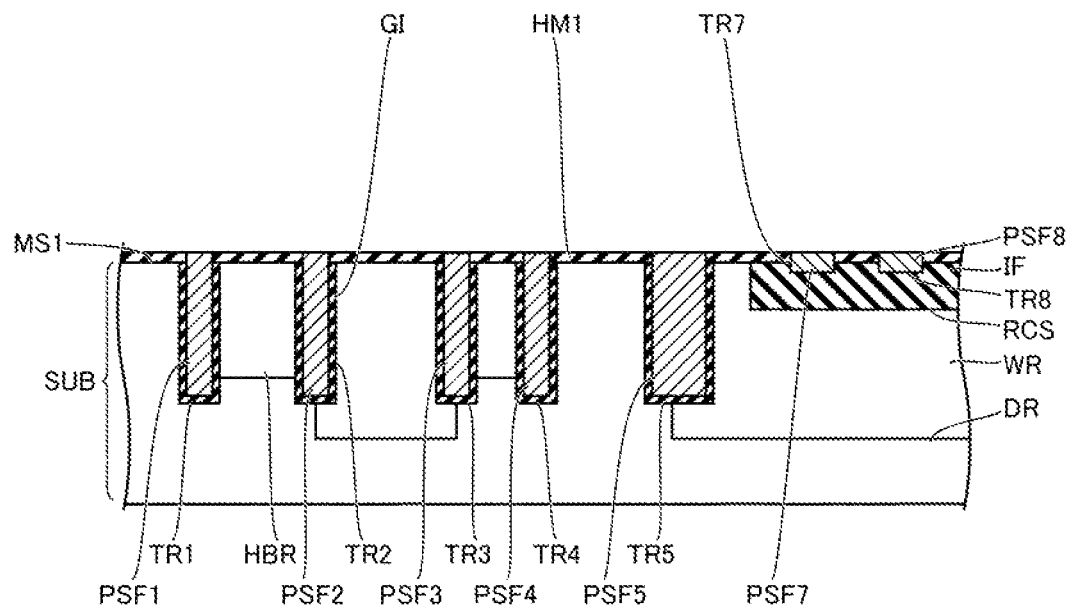
FIG. 45 is a cross-sectional view for explaining a first polysilicon film forming step S6 of the manufacturing method of the semiconductor device DEV2b.

FIG. 45 is a cross-sectional view for explaining a first polysilicon film forming step S6 of the manufacturing method of the semiconductor device DEV2b. As illustrated in FIG. 45, in the first polysilicon film forming step S6 of the manufacturing method of the semiconductor device DEV2b, a polysilicon film PSF7 and a polysilicon film PSF8 are formed in addition to a polysilicon film PSF1, a polysilicon film PSF2, a polysilicon film PSF3, a polysilicon film PSF4, and a polysilicon film PSF5.

In the first polysilicon film forming step S6 of the manufacturing method of the semiconductor device DEV2b, first, polysilicon is embedded in the trench TR1, the trench TR2, the trench TR3, the trench TR4, the trench TR5, the trench TR7, and the trench TR8. The polysilicon is embedded by, for example, CVD. The polysilicon contains an n-type dopant. Second, the polysilicon protruding from the trench TR1, the trench TR2, the trench TR3, the trench TR4, the trench TR5, the trench TR7, and the trench TR8 is removed by, for example, CMP.

Figure 46:
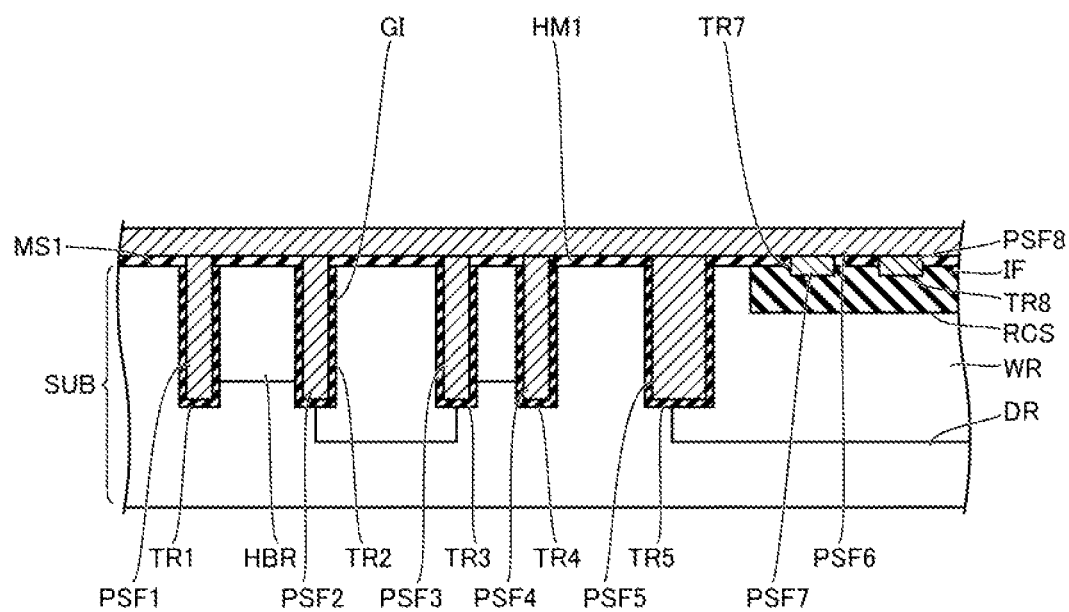
FIG. 46 is a cross-sectional view for explaining a second polysilicon film forming step S7 of the manufacturing method of the semiconductor device DEV2b.

FIG. 46 is a cross-sectional view for explaining a second polysilicon film forming step S7 of the manufacturing method of the semiconductor device DEV2b. As illustrated in FIG. 46, in the second polysilicon film forming step S7 of the manufacturing method of the semiconductor device DEV2b, a polysilicon film PSF6 is disposed on the hard mask HM1 so as to cover the polysilicon film PSF7 and the polysilicon film PSF8.

In in a second impurity diffusion region forming step S8 of the manufacturing method of the semiconductor device DEV2b, note that a p-type dopant is ion-implanted into the polysilicon film PSF6, and the polysilicon film PSF6 is patterned by etching using a resist patterned by photolithography as a mask. In a third impurity diffusion region forming step S9 of the manufacturing method of the semiconductor device DEV2b, a second portion PSF6b is formed in the polysilicon film PSF6 by ion implantation of an n-type dopant, and a portion of the polysilicon film PSF6 where the ion implantation is not performed becomes a first portion PSF6a. In an interlayer insulating film forming step S10 of the manufacturing method of the semiconductor device DEV2b, the upper surface of an interlayer insulating film ILD is planarized by, for example, CMP.

<Effects of Manufacturing Method of Semiconductor Device DEV2b>

Hereinafter, effects of the manufacturing method of the semiconductor device DEV2b will be described.

In the manufacturing method of the semiconductor device DEV2b, a resist for forming a contact hole CH1, a contact hole CH2, a contact hole CH3, a contact hole CH4, and a contact hole CH5 is formed only once as similar to the manufacturing method of the semiconductor device DEV2, and therefore, it is possible to reduce the manufacturing cost for forming the contact hole CH1, the contact hole CH2, the contact hole CH3, the contact hole CH4, and the contact hole CH5.

In the manufacturing method of the semiconductor device DEV2b, the thickness of a portion of the interlayer insulating film ILD where the contact hole CH1, the contact hole CH2, and the contact hole CH3 are formed is different from the thickness of a portion of the interlayer insulating film ILD where the contact hole CH4 and the contact hole CH5 are formed. However, in the manufacturing method of the semiconductor device DEV2b, the polysilicon film PSF7 and the polysilicon film PSF8 are under the polysilicon film PSF6. Therefore, during the contact hole forming step S11, the polysilicon film PSF6 and the polysilicon film PSF7 are prevented from being penetrated by the contact hole CH4, and the polysilicon film PSF6 and the polysilicon film PSF8 are prevented from being penetrated by the contact hole CH5.

The description according to the second embodiment includes the following stated features.

<Statement 1>

A manufacturing method of a semiconductor device includes:
  a step of preparing a semiconductor substrate having a first main surface and a second main surface;
  a step of forming a recess in the first main surface and embedding an insulating film in the recess;
  a step of forming a first trench in the insulating film;
  a step of embedding a first polysilicon film in the first trench;
  a step of forming an interlayer insulating film on the first main surface so as to cover the insulating film and the first polysilicon film; and
  a step of forming a first contact hole and a second contact hole,
  the semiconductor substrate has a first impurity diffusion region formed in the first main surface, and a second impurity diffusion region in contact with a portion of the first impurity diffusion region, the portion being closer to the second main surface,
  the first contact hole is formed so as to penetrate the interlayer insulating film and to expose the second impurity diffusion region from the first contact hole,
  the second contact hole is formed so as to penetrate the interlayer insulating film and to expose the first polysilicon film from the second contact hole,
  first etching and second etching are performed in the step of forming the first contact hole and the second contact hole,
  the second etching is performed after the first etching, and
  after the first etching and before the second etching, the first main surface is exposed from the first contact hole while the first polysilicon film is exposed from the second contact hole.

<Statement 2>

The manufacturing method of the semiconductor device according to Statement 1 further includes:
  a step of forming a hard mask on the first main surface so as to cover the insulating film; and
  a step of forming a second trench in the first main surface,
  in the step of forming the first trench in the insulating film, the first trench that penetrates the hard mask is formed in the insulating film while an opening that penetrates the hard mask is formed in the hard mask by etching using the hard mask,
  in the step of forming the second trench in the first main surface, the second trench is formed at a position corresponding to the opening by etching using the hard mask,
  in the step of embedding the first polysilicon film in the first trench, a second polysilicon film is further embedded in the second trench,
  the first contact hole is formed so as to penetrate the interlayer insulating film and the hard mask and to expose the second impurity diffusion region from the first contact hole, and
  the second contact hole is formed so as to penetrate the interlayer insulating film and to expose the first polysilicon film from the second contact hole.

<Statement 3>

A manufacturing method of a semiconductor device includes:
  a step of preparing a semiconductor substrate having a first main surface and a second main surface;
  a step of forming a recess in the first main surface and embedding an insulating film in the recess;
  a step of forming a hard mask on the insulating film so as to cover the insulating film;
  a step of forming a first trench that penetrates the hard mask in the insulating film, and forming an opening that penetrates the hard mask in the hard mask;
  a step of forming a second trench in the first main surface;
  a step of embedding a first polysilicon film and a second polysilicon film in the first trench and the second trench, respectively;
  a step of forming a third polysilicon film on the hard mask so as to cover the first polysilicon film;
  a step of forming an interlayer insulating film on the first main surface so as to cover the insulating film and the third polysilicon film; and
  a step of forming a first contact hole and a second contact hole,
  the semiconductor substrate has a first impurity diffusion region formed in the first main surface, and a second impurity diffusion region in contact with a portion of the first impurity diffusion region, the portion being closer to the second main surface,
  the second trench is formed at a position corresponding to the opening by etching using the hard mask,
  the first contact hole is formed so as to penetrate the interlayer insulating film and the hard mask and to expose the second impurity diffusion region from the first contact hole, the second contact hole is formed so as to penetrate the interlayer insulating film and to expose the third polysilicon film from the second contact hole, first etching and second etching are performed in the step of forming the first contact hole and the second contact hole, the second etching is performed after the first etching, and after the first and before the second etching, the first main surface is exposed from the first contact hole while the third polysilicon film is exposed from the second contact hole.

Although the invention made by the present inventors has been specifically described on the basis of the embodiments, the present invention is not limited to the above-described embodiments, and it goes without saying that various modifications can be made without departing from the gist of the present invention.

In the foregoing, the invention made by the present inventors has been concretely described on the basis of the embodiments. However, it is needless to say that the present invention is not limited to the foregoing embodiments, and various modifications can be made within the scope of the present invention.

What is claimed is:

1. A manufacturing method of a semiconductor device comprising the steps of:
   preparing a semiconductor substrate having a first main surface and a second main surface;
   forming a recess in the first main surface and embedding an insulating film in the recess;
   forming a polysilicon film on the insulating film;
   forming an interlayer insulating film on the first main surface so as to cover the insulating film and the polysilicon film; and
   forming a first contact hole and a second contact hole,
   wherein the semiconductor substrate has a first impurity diffusion region formed in the first main surface, and a second impurity diffusion region in contact with a portion of the first impurity diffusion region, the portion being closer to the second main surface,
   the first contact hole is formed so as to penetrate the interlayer insulating film and to expose the second impurity diffusion region from the first contact hole,
   the second contact hole is formed so as to penetrate the interlayer insulating film and to expose the polysilicon film from the second contact hole,
   first etching, second etching and third etching are performed in the step of forming the first contact hole and the second contact hole,
   the second etching is performed after the first etching,
   the third etching is performed after the second etching,
   after the first etching and before the second etching, the first main surface is exposed from the first contact hole while the interlayer insulating film remains in a bottom surface of the second contact hole,
   after the second etching and before the third etching, the second impurity diffusion region is exposed from the first contact hole while the interlayer insulating film remains in the bottom surface of the second contact hole, and
   after the third etching, the polysilicon film is exposed from the second contact hole.

2. The manufacturing method of the semiconductor device according to claim 1,
   wherein an opening area of the second contact hole in plan view is larger than an opening area of the first contact hole in plan view, and
   a condition of the first etching is set such that a deposition amount during the first etching increases as the opening area of the second contact hole in plan view increases.

3. The manufacturing method of the semiconductor device according to claim 2,
   wherein an etching gas used for the first etching is a fluorocarbon-based gas having a C/F ratio that is equal to or higher than 0.50, and is used together with argon and oxygen, and
   a temperature of the semiconductor substrate during the first etching is equal to or lower than 20° C.

4. The manufacturing method of the semiconductor device according to claim 1,
   wherein the first contact hole and the second contact hole extend in a first direction in plan view,
   a width of the first contact hole in a second direction orthogonal to the first direction is larger than a width of the second contact hole in the second direction, and
   a condition of the first etching is set such that the width of the first contact hole in the second direction and the width of the second contact hole in the second direction decrease as a distance from an upper surface of the interlayer insulating film increases.

5. The manufacturing method of the semiconductor device according to claim 4,
   wherein an etching gas used for the first etching is a fluorocarbon-based gas, and contains hydrogen.

6. The manufacturing method of the semiconductor device according to claim 1,
   wherein the first contact hole and the second contact hole extend in a first direction in plan view,
   a width of the first contact hole in a second direction orthogonal to the first direction is larger than a width of the second contact hole in the second direction, and
   a condition of the first etching is set such that an etching rate decreases as the width of the second contact hole in the second direction decreases.

7. The manufacturing method of the semiconductor device according to claim 6,
   wherein an etching gas used for the first etching is a fluorocarbon-based gas, and
   a pressure in a chamber during the first etching is equal to or higher than 50 mTorr.

8. The manufacturing method of the semiconductor device according to claim 1, further comprising the steps of:
   forming a resist on the interlayer insulating film; and
   patterning the resist by photolithography so that the resist has a first opening at a position corresponding to the first contact hole, and a second opening at a position corresponding to the second contact hole,
   wherein, before the first etching, the interlayer insulating film is exposed from the first opening while the resist remains in a bottom surface of the second opening, and
   a condition of the first etching is set such that an etching rate for the interlayer insulating film is larger than an etching rate for the resist.

9. The manufacturing method of the semiconductor device according to claim 8,
   wherein, in the photolithography, the resist is exposed using a reticle having a first light-transmitting section and a second light-transmitting section,
   portions of the resist where the first opening and the second opening are formed are exposed by light transmitted through the first light-transmitting section and light transmitted through the second light-transmitting section, respectively, and a transmittance of the first light-transmitting section is higher than a transmittance of the second light-transmitting section.

10. The manufacturing method of the semiconductor device according to claim 9,
wherein an etching gas used for the first etching is a fluorocarbon-based gas having a C/F ratio that is equal to or higher than 0.5, and is used together with argon and oxygen.

\* \* \* \* \*